(12) United States Patent
Chuu et al.

(10) Patent No.: US 12,230,680 B2
(45) Date of Patent: Feb. 18, 2025

(54) MANUFACTURING METHOD OF SEMICONDUCTOR DEVICE INCLUDING hBNC LAYER, AND MANUFACTURING METHOD OF HBNC LAYER

(71) Applicant: Taiwan Semiconductor Manufacturing Company, Ltd., Hsinchu (TW)

(72) Inventors: Chih-Piao Chuu, Hsinchu (TW); Tse-An Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 495 days.

(21) Appl. No.: 17/460,327

(22) Filed: Aug. 30, 2021

(65) Prior Publication Data

US 2023/0066449 A1    Mar. 2, 2023

(51) Int. Cl.
| H01L 29/205 | (2006.01) |
| H01L 21/02  | (2006.01) |
| H01L 29/04  | (2006.01) |
| H01L 29/16  | (2006.01) |

(52) U.S. Cl.
CPC ...... *H01L 29/205* (2013.01); *H01L 21/02444* (2013.01); *H01L 21/0254* (2013.01); *H01L 29/045* (2013.01); *H01L 29/1606* (2013.01)

(58) Field of Classification Search
CPC ............. H01L 29/205; H01L 21/02444; H01L 21/0254; H01L 29/045; H01L 29/1606; H01L 21/02645; H01L 2221/6835; H01L 2221/68368; H01L 21/0242; H01L 21/02433; H01L 21/02458; H01L 21/02491; H01L 21/02494; H01L 21/02516; H01L 21/02527; H01L 21/0259; H01L 21/02658; H01L 21/6835; H01L 29/78681; H01L 29/78684; H01L 29/78696; H01L 21/0262; H01L 29/1033; H01L 29/2003; H01L 29/66477; H01L 29/78
USPC ......................................................... 257/76
See application file for complete search history.

(56) References Cited

U.S. PATENT DOCUMENTS

| 10,243,104 B2* | 3/2019 | Weman | H01L 21/02444 |
| 10,692,977 B2* | 6/2020 | Withers | H01L 33/26 |
| 2010/0258787 A1* | 10/2010 | Chae | H01L 29/78684 257/39 |
| 2012/0088039 A1* | 4/2012 | Yu | B82Y 40/00 427/596 |

(Continued)

OTHER PUBLICATIONS

Wang et al "Surface Monocrystallization of Copper Foil for Fast Growth of Large Single-Crystal Graphene under Free Molecular Flow" Advanced Materials Aug. 26, 2016 https://doi.org/10.1002/adma.201603579. (Year: 2016).*

(Continued)

*Primary Examiner* — Jami Valentine Miller
*Assistant Examiner* — Pratiksha Jayant Lohakare
(74) *Attorney, Agent, or Firm* — JCIPRNET

(57) ABSTRACT

A transistor includes a channel layer, a gate stack, and source/drain regions. The channel layer includes a graphene layer and hexagonal boron nitride (hBN) flakes dispersed in the graphene layer. Orientations of the hBN flakes are substantially aligned. The gate stack is over the channel layer. The source/drain regions are aside the gate stack.

20 Claims, 24 Drawing Sheets

(56) References Cited

U.S. PATENT DOCUMENTS

| | | | | |
|---|---|---|---|---|
| 2013/0272951 | A1* | 10/2013 | Hiura | H01L 29/78684 423/448 |
| 2014/0353722 | A1* | 12/2014 | Zhang | H01L 29/66045 257/194 |
| 2015/0144881 | A1* | 5/2015 | Seacrist | H01L 21/02502 257/26 |
| 2016/0115032 | A1* | 4/2016 | Wodtke | C01B 32/188 205/291 |
| 2017/0059514 | A1* | 3/2017 | Hoffman | G01N 33/5438 |
| 2019/0120830 | A1* | 4/2019 | Hoffman | G01N 33/5438 |
| 2019/0345603 | A1* | 11/2019 | Ago | C30B 25/18 |
| 2020/0109487 | A1* | 4/2020 | Kim | H01L 21/02658 |
| 2021/0328049 | A1* | 10/2021 | Clark | H01L 27/0688 |
| 2022/0041453 | A1* | 2/2022 | Choi | C30B 29/60 |

OTHER PUBLICATIONS

Flexible Graphene Field-Effect Transistors Encapsulated in Hexagonal Boron Nitride Nicholas Petrone, ACS Nano (Year: 2015).*

Wafer-scale single-crystal hexagonal boron nitride monolayers on Cu (111) Tse-An Chen, Chih-Piao Chuu, Chien-Chih Tseng, Chao-Kai Wen, H .-S. Philip Wong, Shuangyuan Pan, Rongtan Li, Tzu-Ang Chao, Wei-Chen Chueh, Nature vol. 579 ,219-223 (Year: 2020).*

Seong-Jun Yang et al "Wafer-Scale Programmed assembly of one-Atom thick Crystal" Pohang University of Science and Technology. Jun. 12-17, 2022, Southern New Hampshire University (Year: 2022).*

Tse-An Chen et al., "Wafer-scale single-crystal hexagonal boron nitride monolayers on Cu (111)," Nature, Mar. 2020, pp. 1-18.

Regiane Nascimento et al., "Band Gaps of BN-Doped Graphene: Fluctuations, Trends, and Bounds", The Journal of Physical Chemistry C, Feb. 16, 2015, pp. 5055-5061.

Cheng-Kai Chang et al., "Band Gap Engineering of Chemical Vapor Deposited Graphene by in Situ BN Doping", ACS Nano, Feb. 26, 2013, pp. 1-9.

Yongji Gong et al., "Direct chemical conversion of graphene to boron- and nitrogen- and carbon-containing atomic layers", Nature Communications, Jan. 24, 2014, pp. 1-8.

* cited by examiner

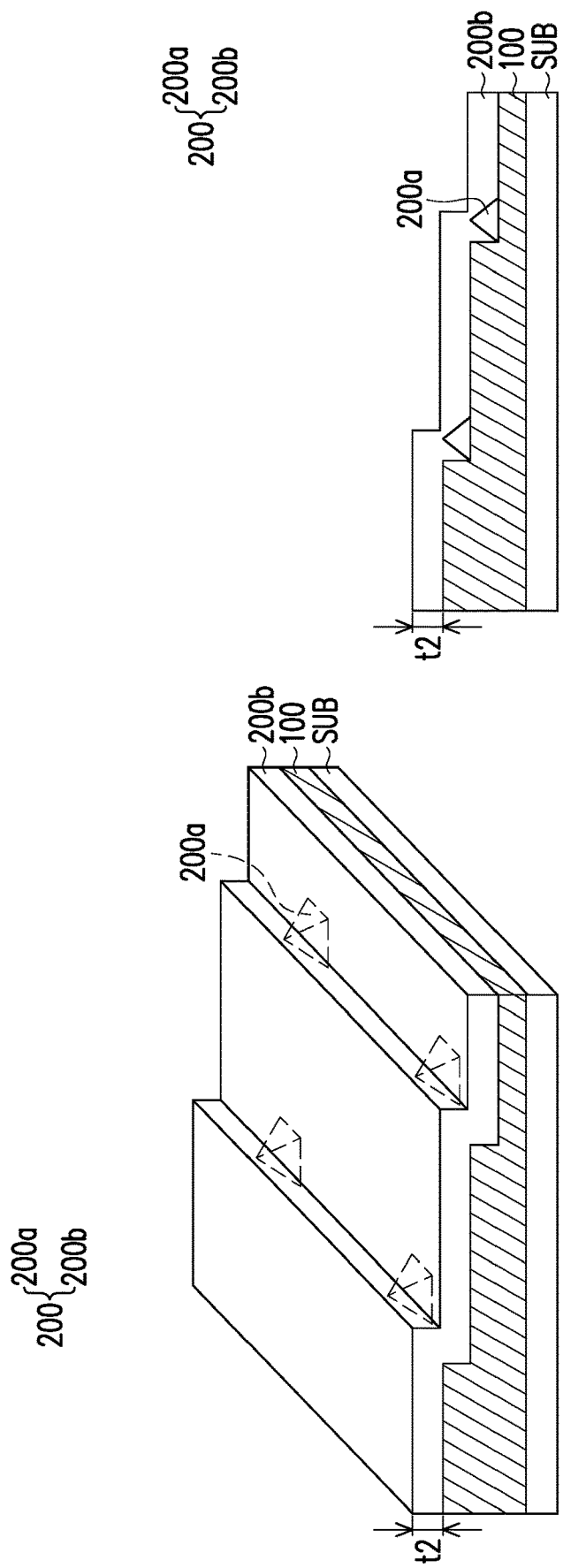

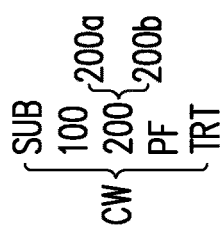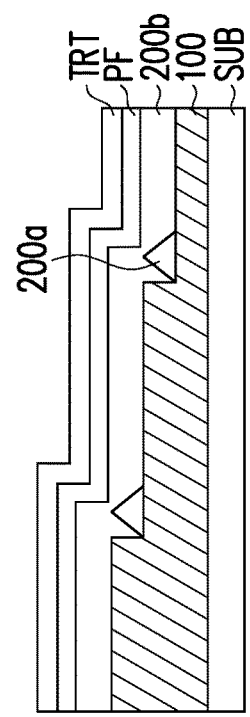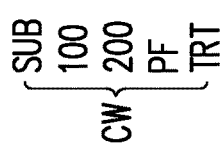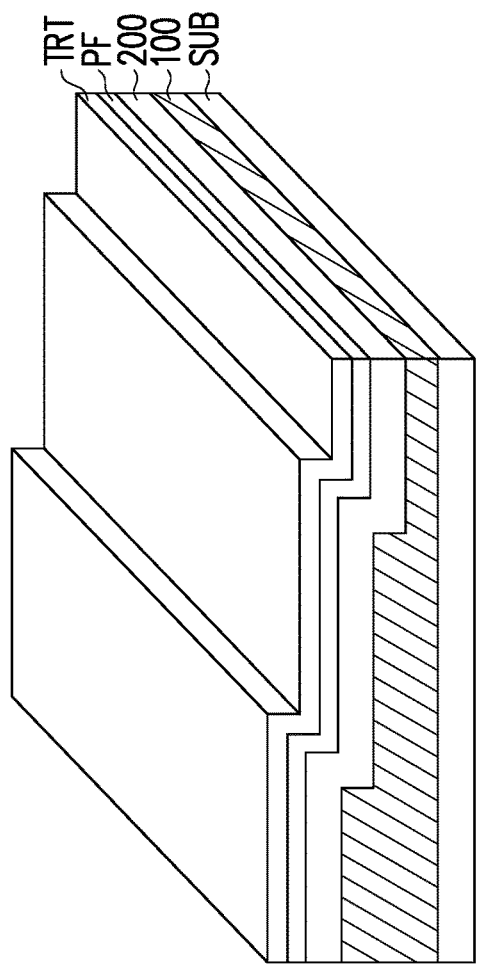

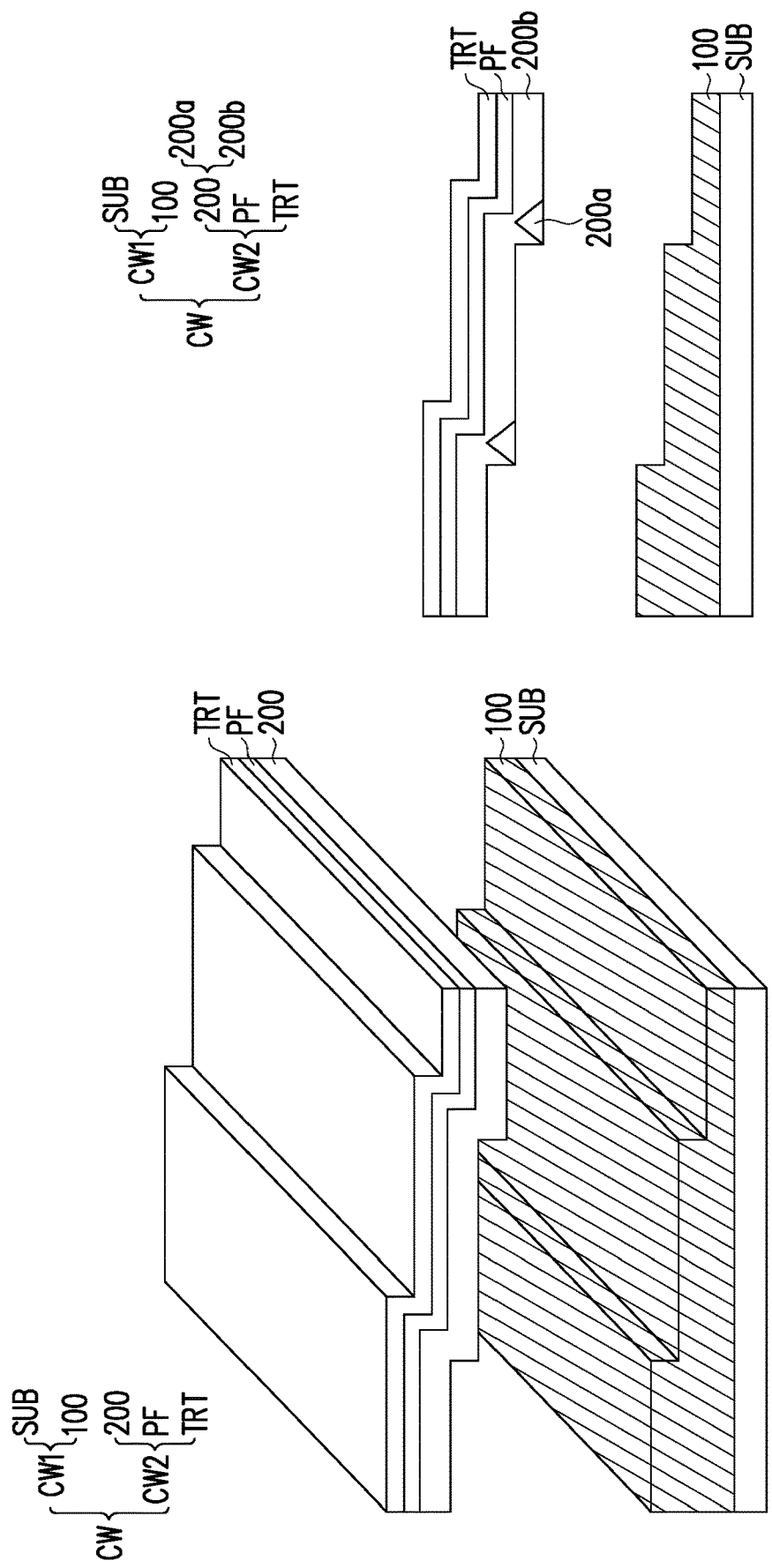

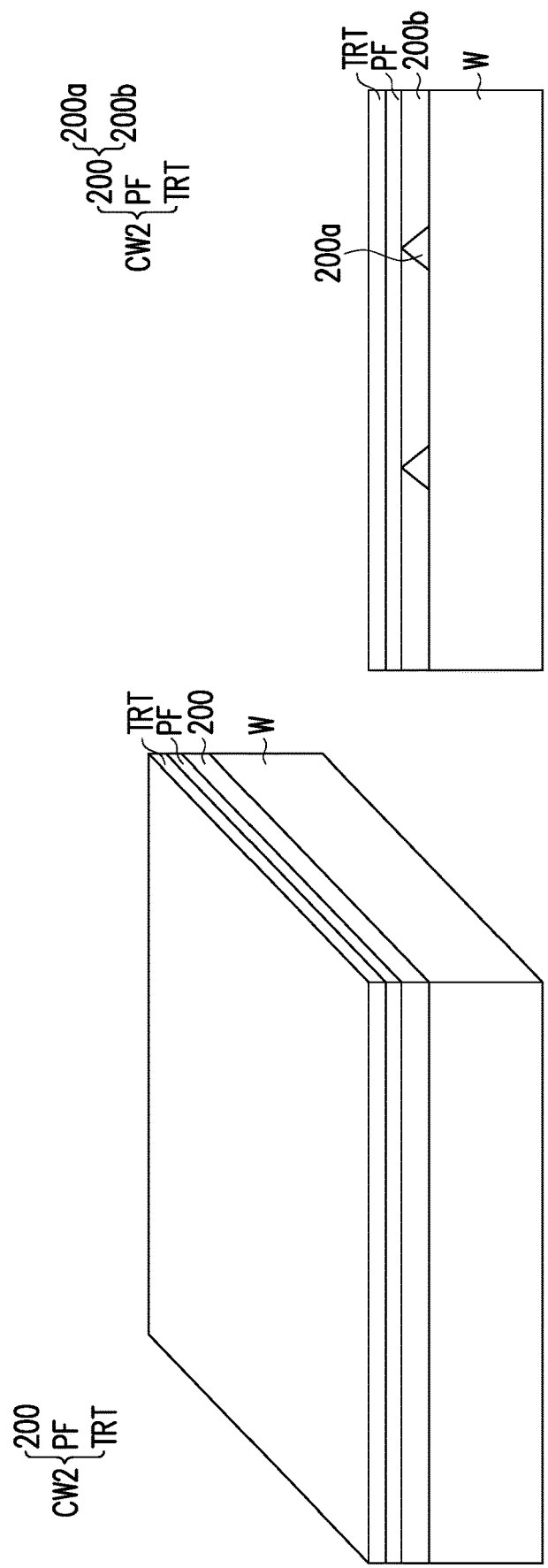

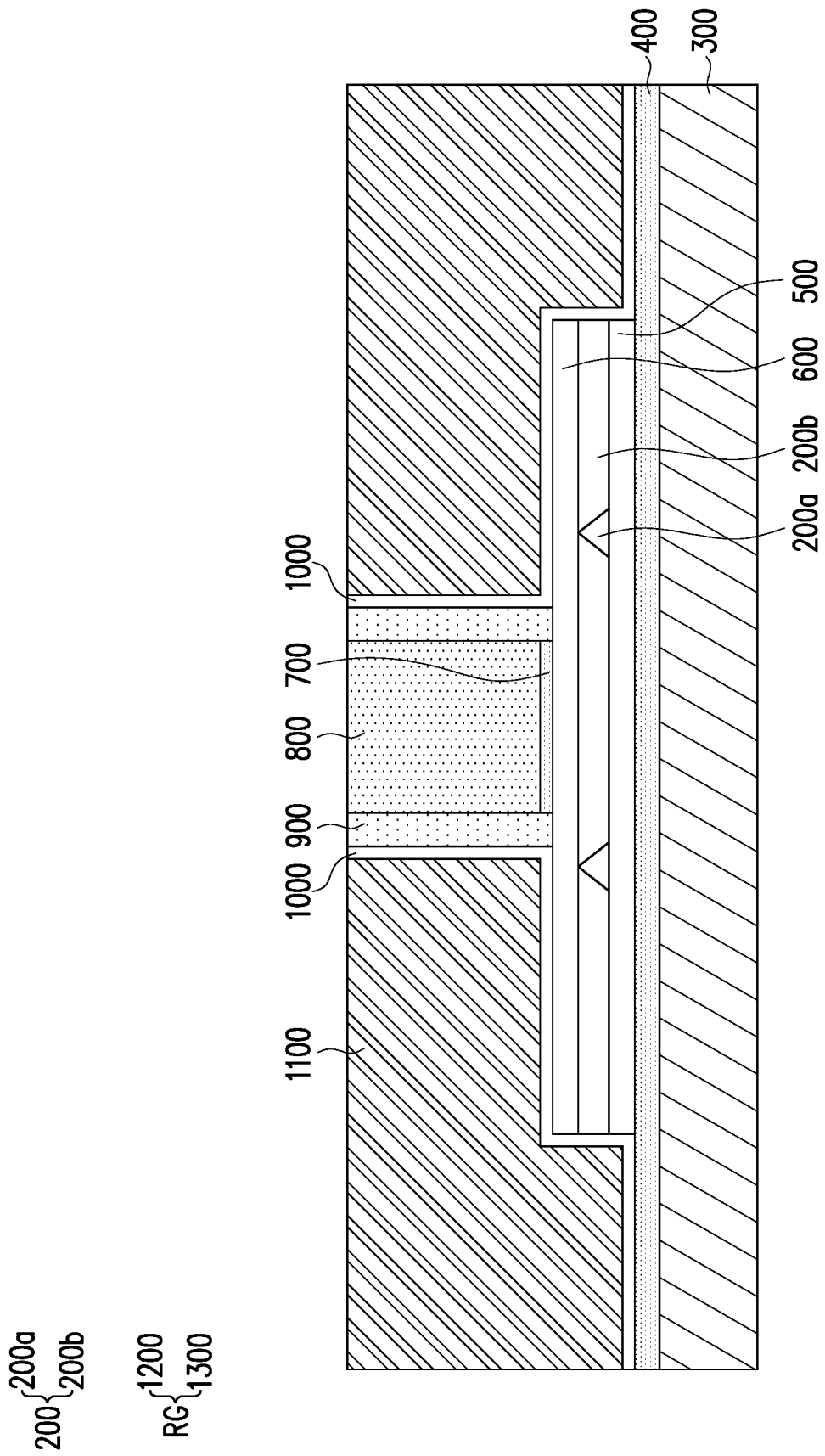

MANUFACTURING METHOD OF SEMICONDUCTOR DEVICE INCLUDING hBNC LAYER, AND MANUFACTURING METHOD OF HBNC LAYER

BACKGROUND

In recent development of integrated circuits, two dimensional (2D) semiconductor electronic devices were studied. A 2D transistor may include a 2D channel, which includes a channel having the thickness in atomic scale, with the channel formed between two insulator layers. The implementation of 2D transistors on physical wafers, however, runs into problems. For example, in previous research effort, the band gap of channel material is not stable to control electronic characteristics in fabrication processes and is subject to leakage, molecular absorption, carrier mobility downgrade, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1I are perspective views illustrating various stages of a method of forming and transferring a hBNC layer onto a wafer in accordance with some embodiments of the disclosure.

FIG. 2A to FIG. 2I are cross-sectional views illustrating various stages of the method of forming and transferring the hBNC layer onto the wafer in FIG. 1A to FIG. 1I.

FIG. 5A to FIG. 5G are cross-sectional views illustrating various stages of a method of manufacturing a semiconductor device in accordance with some alternative embodiments of the disclosure.

DETAILED DESCRIPTION

Figure 1A:
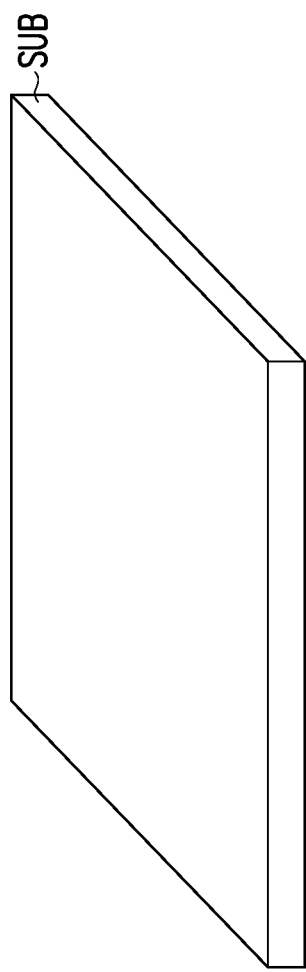

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1I are perspective views illustrating various stages of a method of forming and transferring a hBNC (hexagonal boron nitride carbon) layer 200 onto a wafer W in accordance with some embodiments of the disclosure. FIG. 2A to FIG. 2I are cross-sectional views illustrating various stages of the method of forming and transferring the hBNC layer 200 onto the wafer W in FIG. 1A to FIG. 1I.

Figure 2A:
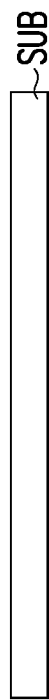

Referring to FIG. 1A and FIG. 2A, a substrate SUB is provided. In some embodiments, the substrate SUB includes a sapphire substrate. In some embodiments, the sapphire substrate is a single-crystalline substrate. In some embodiments, the substrate SUB is a c-plane sapphire substrate (sometimes referred to as a "c-sapphire") substrate. However, the disclosure is not limited thereto. In some alternative embodiments, the substrate SUB may be a sapphire substrate with other planes, such as M plane sapphire substrate, R plane sapphire substrate, or A plane sapphire substrate. In some embodiments, the substrate SUB is in a wafer form or in a panel form. For example, the substrate SUB may be circular or rectangular from a top view. In some embodiments, the diameter of the substrate SUB is 3 inch, 12 inch, or greater.

Figure 2B:
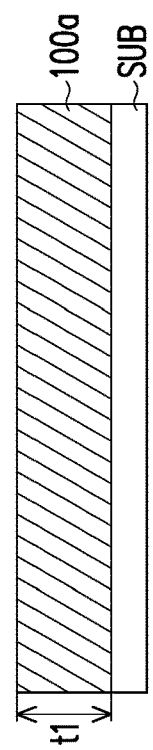
Figure 1B:
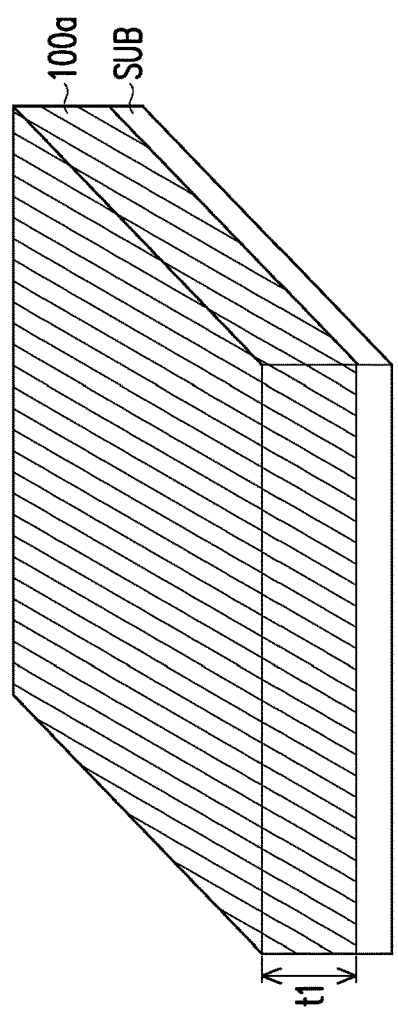

Referring to FIG. 1B and FIG. 2B, a copper film 100a is deposited on the substrate SUB. In some embodiments, the copper film 100a is deposited onto the substrate SUB through a sputtering process or other suitable methods. For example, the deposition of the copper film 100a may be performed by sputtering copper from a copper target. During the deposition, argon (Ar) may be used as the process/sputter gas. In addition to argon, hydrogen ($H_2$) may also be added as a process gas during the deposition of the copper film 100a. The addition of hydrogen may prevent undesirable oxidation of the copper film 100a. In some embodiments, the pressure of the process gas (i.e. Ar and $H_2$) is in a range from about 1 Torr to about 500 Torr.

In some embodiments, the copper film 100a has a surface orientation in (111) direction. In some embodiments, it is preferred that the resulting copper film 100a has a good crystalline structure (for example, a polycrystalline structure). In some embodiments, the crystalline structure of the resulting copper film 100a is controlled by various process parameters, such as growth temperature, deposition rate, or the like.

In some embodiments, the growth temperature of the copper film 100a ranges from about 900° C. to about 1100° C. When the growth temperature is too low (i.e. lower than about 900° C.), the copper film 100a may not have crystalline structure or may have low quality of crystalline structure. In addition, when the growth temperature is too low (i.e. lower than about 900° C.), the grain sizes of the copper film 100a may be too small or the copper film 100a may become amorphous. For example, when the growth temperature is lower than 900° C., the orientation of the crystalline structure in neighboring grains may be rotated relative to each other (by 60 degrees), and thus have different orientations. Boundaries are accordingly generated between the neighboring grains. On the other hand, when the growth temperature is too high (i.e. higher than about 1100° C.), the copper film 100a may evaporate at the same time as it is deposited. Moreover, the growth temperature of higher than about 1100° C. would likely to destruct the crystalline structure. For example, the growth temperature of higher than about 1100° C. would result in partial melting of the copper film 100a.

In some embodiments, the deposition rate of the copper film 100a is controlled to be not too high, so as to achieve the good crystalline structure. If the deposition rate is too high, an amorphous structure may be formed. However, the deposition rate of the copper film 100a cannot be too low. As mentioned above, the deposition is performed at a high temperature, and the deposited copper may evaporate. If the deposition rate is too low, the evaporation rate may exceed deposition rate, and the copper layer, instead of having thickness increased with the proceeding of deposition, may adversely have net reduction in the thickness.

By precisely controlling the growth temperature and the deposition rate, the copper film 100a may be formed to have a polycrystalline structure. In some embodiments, a thickness t1 of the copper film 100a is also controlled to be within a certain range. In some embodiments, the thickness t1 of the copper film 100a ranges from about 400 nm to about 600 nm. It is appreciated that with the increase in thickness t1 of copper film 100a, more grains tend to be generated in copper film 100a, which means that the grain sizes become increasingly smaller, and hence the quality of the newly grown upper portions of copper film 100a is degraded compared to the lower portions of copper film 100a. On the other hand, if copper film 100a is too thin, a large portion of the copper film 100a would be evaporated during the subsequent high temperature processes (such as the annealing process), causing difficulty in forming other layers on the copper film 100a.

Referring to FIG. 1B to FIG. 1C and FIG. 2B to FIG. 2C, a thermal annealing process TA is performed on the copper film 100a to convert the copper film 100a into copper film 100. As mentioned above, the copper film 100a has the polycrystalline structure. On the other hand, the copper film 100 has a single-crystalline structure. In other words, the thermal annealing process TA converts the polycrystalline structure into the single-crystalline structure. In some embodiments, the thermal annealing process TA is performed in a chamber with $H_2$ as a process gas. The use of $H_2$ as the process gas may reduce any oxidized part of the copper film 100a back into elemental copper, and may further prevent the oxidation of the copper film 100a. In some embodiments, the annealing temperature of the thermal annealing process TA ranges from about 500° C. to about 1100° C. When the annealing temperature is too low (i.e. lower than about 500° C.), the effect of the structure conversion is not satisfactory, or the annealing may take too long to fully convert the polycrystalline structure into the single-crystalline structure. On the other hand, when the annealing temperature is too high (i.e. higher than about 1,100° C.), copper film 100a may evaporate with the proceeding of the annealing process. Moreover, the annealing temperature of higher than about 1100° C. would likely to destruct the crystalline structure. For example, the annealing temperature of higher than about 1100° C. would result in partial melting of the copper film 100a.

Figure 1C:
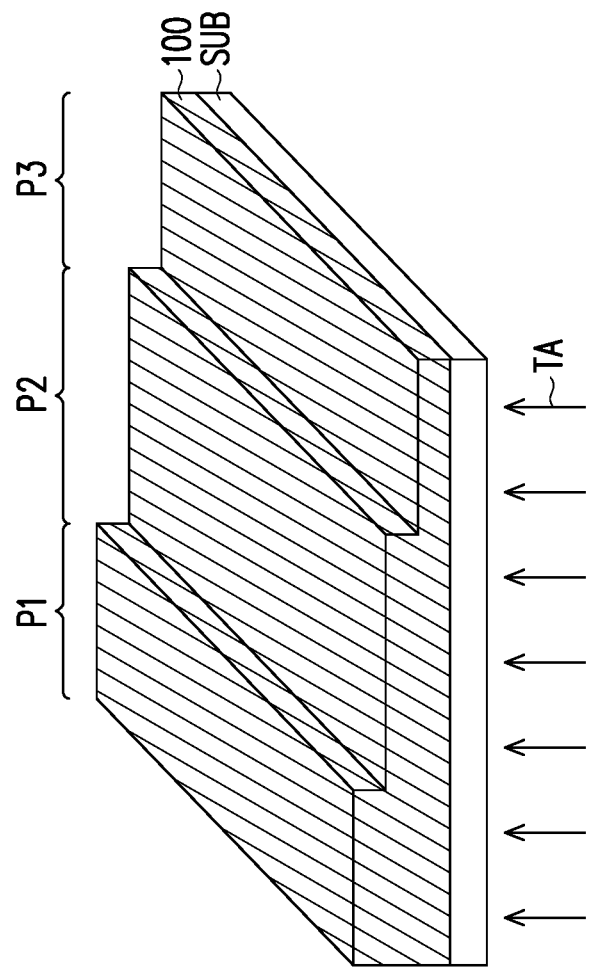
Figure 2C:
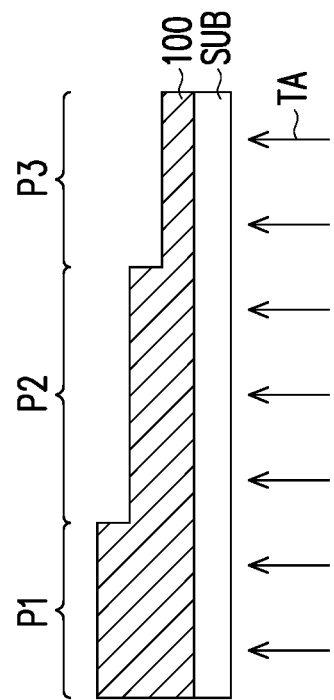

As aforementioned, to effectively convert the polycrystalline structure into single-crystalline structure, the annealing temperature is preferably high (but not excessively high). This may cause the evaporation of copper and the reduction in the thickness t1 of copper film 100a. To reduce the evaporation, the heat for the thermal annealing process TA is provided from the backside of the substrate SUB, as shown in FIG. 1C and FIG. 2C. In other words, the substrate SUB may serve as a buffer layer for preventing the copper film 100a from directly subjected to the high temperature heat. This allows the annealing temperature to be increased while still keep the evaporation rate on check. Furthermore, the increase in the chamber pressure may also reduce the evaporation. In some embodiments, during the thermal annealing process TA, the pressure of the process gas is in the range from about 760 Torr to about 0.1 Torr. In some embodiments, the annealing duration of the thermal annealing process TA ranges from about 10 minutes to about 480 minutes.

As mentioned above, after the thermal annealing process TA, the copper film 100 has a single-crystalline structure. In some embodiments, the surface orientation of the copper film 100 is in (111) direction. It is appreciated that the copper film 100 with the (111) surface orientation has a low surface energy, and hence it is relatively easy to form a single-crystalline film with the (111) surface orientation. In some embodiments, the thermal annealing process TA removes the wrinkling of the copper film 100. For example, the thermal annealing process TA removes the grain boundaries within the copper film 100, so as to provide a satisfactory surface for layers subsequently formed thereon.

As illustrated in FIG. 1C and FIG. 2C, after the thermal annealing process TA, the copper film 100 has a stair case profile. In some embodiments, the copper film 100 is divided into a first portion P1, a second portion P2, and a third portion P3. The first portion P1 is connected to the second portion P2, and the second portion P2 is connected to the third portion P3. In some embodiments, a thickness of the first portion P1 is greater than a thickness of the second portion P2, and the thickness of the second portion P2 is greater than a thickness of third portion P3. In some embodiments, top surfaces of the first portion P1, the second portion P2, and the third portion P3 are located at different level heights. For example, as illustrated in FIG. 1C and FIG. 2C, the top surface of the first portion P1 is located at a level height higher than that of the top surface of the second portion P2. Similarly, the top surface of the second portion P2 is located at a level height higher than that of the top surface of the third portion P3. That is, the top surface of the copper film 100 is not flat.

Figure 2D:
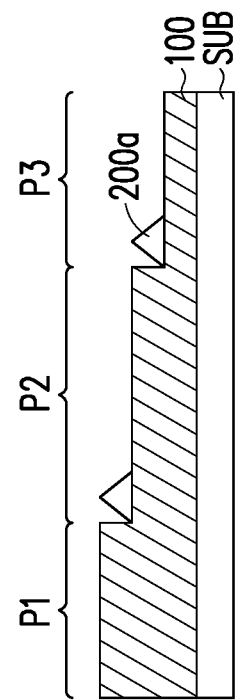
Figure 1D:
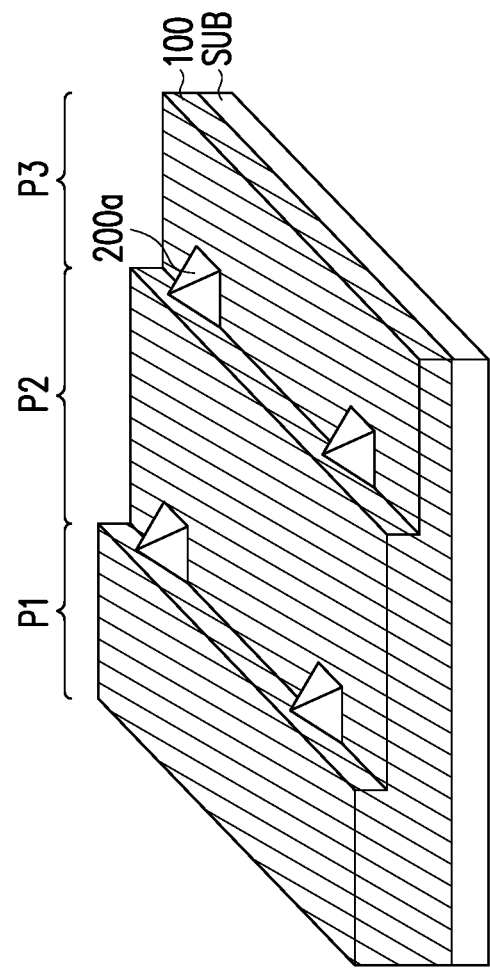

Referring to FIG. 1D and FIG. 2D, a plurality of hexagonal boron nitride (hBN) flakes 200a is formed on the copper film 100. In some embodiments, the hBN flakes 200a is deposited through chemical vapor deposition (CVD), low-pressure chemical vapor deposition (LPCVD), or other suitable deposition methods. In some embodiments, the precursors (for example, the process gases) for forming the hBN flakes 200a include ammonia borane ($H_3NBH_3$), borazine ($B_3H_6N_3$), a combination thereof, and/or the like. In some embodiments, the hBN flakes 200a are deposited at a temperature ranging from about 900° C. to about 1050° C. In some embodiments, during the deposition of the hBN flakes 200a, the exposed copper atoms of the copper film 100 act as a catalyst to activate the precursor molecules (i.e. boron and nitride), so the boron nitride flakes (i.e. the hBN flakes 200a) can be grown on the copper film 100.

In some embodiments, it is preferred to grow/deposit the hBN flakes 200a in a dispersed manner. Therefore, the duration for depositing the hBN flakes 200a is rather short. When the deposition time for the hBN flakes 200a is too long, the hBN flakes 200a would aggregate to form a hBN film with large area, which would result in unwanted phase segregation when other materials are deposited in later steps. In some embodiments, the deposition time of the precursors of hBN flakes 200a ranges from about 1 minutes to about 30 minutes, which is shorter than the typical deposition time.

In some embodiments, since the hBN flakes 200a are grown on the single-crystalline copper film 100, with appropriate process conditions for deposition, the hBN flakes 200a may be formed to have a single-crystalline structure, as deposited. For example, the hBN flakes 200a are single oriented. In some embodiments, since the copper film 100 has the stair case profile, the steps in the stair case are able to serve as alignment mechanisms for the hBN flakes 200a. As illustrated in FIG. 1D and FIG. 2D, the hBN flakes 200a are attached to step edges of the (111) terrace of the copper film 100. For example, the hBN flakes 200a disposed on the second portion P2 of the copper film 100 is attached to sidewalls of the protruding part of the first portion P1. Similarly, the hBN flakes 200a disposed on the third portion P3 of the copper film 100 is attached to sidewalls of the protruding part of the second portion P2. In other words, although the hBN flakes 200a are grown in a dispersed manner, patterns can still be seen in the arrangement of the hBN flakes 200a. That is, the hBN flakes 200a are self-aligned. As mentioned above, the thermal annealing process TA removes the grain boundaries within the copper film 100. As such, even when the concentration of the precursors for hBN flakes 200a is low, the orientation of the hBN flakes 200a formed can still be controlled. For example, the boron atoms and the nitride atoms in the hBN flakes 200a may be formed in a same phase or a same orientation, thereby resulting aligned hBN flakes 200a on the copper film 100. That is, orientations of the hBN flakes 200a are substantially aligned.

In some embodiments, the lattice constant of copper film 100 is close to the lattice constant of the hBN flakes 200a. Therefore, the hBN flakes 200a grown on the copper film 100 may have fewer faults. In some embodiments, by controlling the process conditions for forming the copper film 100 and the hBN flakes 200a, the (111) surface orientation may be generated in the hBN flakes 200a.

Referring to FIG. 1E and FIG. 2E, a graphene layer 200b is formed on the copper film 100. In some embodiments, the graphene layer 200b is formed to wrap around the hBN flakes 200a. That is, the graphene layer 200b is formed on the copper film 100 exposed by the hBN flakes 200a. In some embodiments, the graphene layer 200b is deposited through CVD, LPCVD, or other suitable deposition methods. In some embodiments, the precursors (for example, the process gases) for forming the graphene layer 200b include methane ($CH_4$) and/or the like. In some embodiments, the graphene layer 200b is deposited at a temperature ranging from about 900° C. to about 1050° C.

In some embodiments, the graphene layer 200b is disposed on portions of a top surface of the copper film 100a that is not covered by the hBN flakes 200a. For example, the graphene layer 200b fills a space between the hBN flakes 200a. In some embodiments, a duration for depositing the graphene layer 200b is longer than the duration for depositing the hBN flakes 200a. In some embodiments, the deposition time of the graphene layer 200b ranges from about 5 minutes to about 60 minutes. Similarly, the flow rate of the precursors (i.e. the process gases) for forming the graphene layer 200b is also faster than the flow rate of the precursors (i.e. the process gas) for forming the hBN flakes 200a.

In some embodiments, the graphene layer 200b is conformally formed on the copper film 100. In other words, the graphene layer 200b also has a stair case profile. In some embodiments, since the graphene layer 200b is grown on the single-crystalline copper film 100, with appropriate process conditions for deposition, the graphene layer 200b may be formed to have a single-crystalline structure, as deposited. For example, the graphene layer 200b is single oriented. In some embodiments, by controlling the process conditions for forming the copper film 100 and the graphene layer 200b, the (111) surface orientation may be generated in the graphene layer 200b.

In some embodiments, the hBN flaks 200a and the graphene layer 200b are collectively referred to as a hBNC layer 200. In some embodiments, the hBNC layer 200 is formed to have a uniform thickness t2. In some embodiments, the thickness t2 is an atomic thin thickness, which is less than 1 nm. In some embodiments, the hBNC layer 200 is a uniform hybrid film including the hBN flakes 200a and the graphene layer 200b. In some embodiments, the hBNC layer 200 has an isomorphous structure. In some embodiments, the graphene layer 200b is considered to be doped with the hBN flakes 200a. In some embodiments, a content of the hBN flakes 200a in the hBNC layer 200 ranges from about 1% to about 30%. When the content of the hBN flakes 200a in the hBNC layer 200 is too high, the hBN flakes 200a would aggregate to form a hBN film with large area, which would result in phase segregation of the hBN film (i.e. the aggregated hBN flakes 200a) and the graphene layer 200b due to thermodynamics, thereby forming a non-uniform, non-semiconducting hBNC layer 200.

By adapting the two steps process as shown in FIG. 1D to FIG. 1E and FIG. 2D to FIG. 2E, the hBNC layer 200 may be formed as a h-BNC monolayer with single-crystalline structure. In some embodiments, well lattice mismatch (<1.5%) and high intrinsic band gap in pristine monolayer form (about 6 eV) allow the hBN flakes 200a to be one of the best candidates to modulate the band gap of the graphene layer 200b, thereby forming the hBNC layer 200 with a suitable band gap to be used as a channel layer in a transistor. For example, the hBNC layer 200 may have a band gap of about 0.1 eV to about 2 eV depending on the doping concentration, and a carrier mobility of about 1000 to few thousands $cm^2V^{-1}s^{-1}$. As such, transistors utilizing the hBNC layer 200 may exhibit excellent device performance.

After the formation of the hBNC layer 200, the hBNC layer 200 may be transferred onto a wafer W. The transfer process is shown in FIG. 1F to FIG. 1I and FIG. 2F to FIG. 2I. Referring to FIG. 1F and FIG. 2F, a protection film PF and a thermal release tape TRT are sequentially formed on the hBNC layer 200. In some embodiments, the protection film PF and the thermal release tape TRT are conformally formed on the hBNC layer 200, so the protection film PF and the thermal release tape TRT also have a stair case profile, respectively. In some embodiments, the protection film PF has the function of protecting the hBNC layer 200 from being damaged during the transfer process. In some embodiments, the protection film PF includes polymethyl methacrylate (PMMA), which is in a flowable form, and is coated on the hBNC layer 200. In some embodiments, the protection film PF is coated on the hBNC layer 200 through spin coating or other suitable methods. After coating, the flowable film is cured and solidified to form the protection film PF. However, the disclosure is not limited thereto. In some alternative embodiments, other types of flowable and curable material or dry film that may provide protection may also be used as the protection film PF.

In some embodiments, the thermal release tape TRT is formed of a material that may lose adhesion under a thermal condition or other conditions (such as radiation). In some embodiments, the substrate SUB, the copper film 100, the hBNC layer 200, the protection film PF, and the thermal release tape TRT is collectively referred to as a composite wafer CW.

Figure 3:
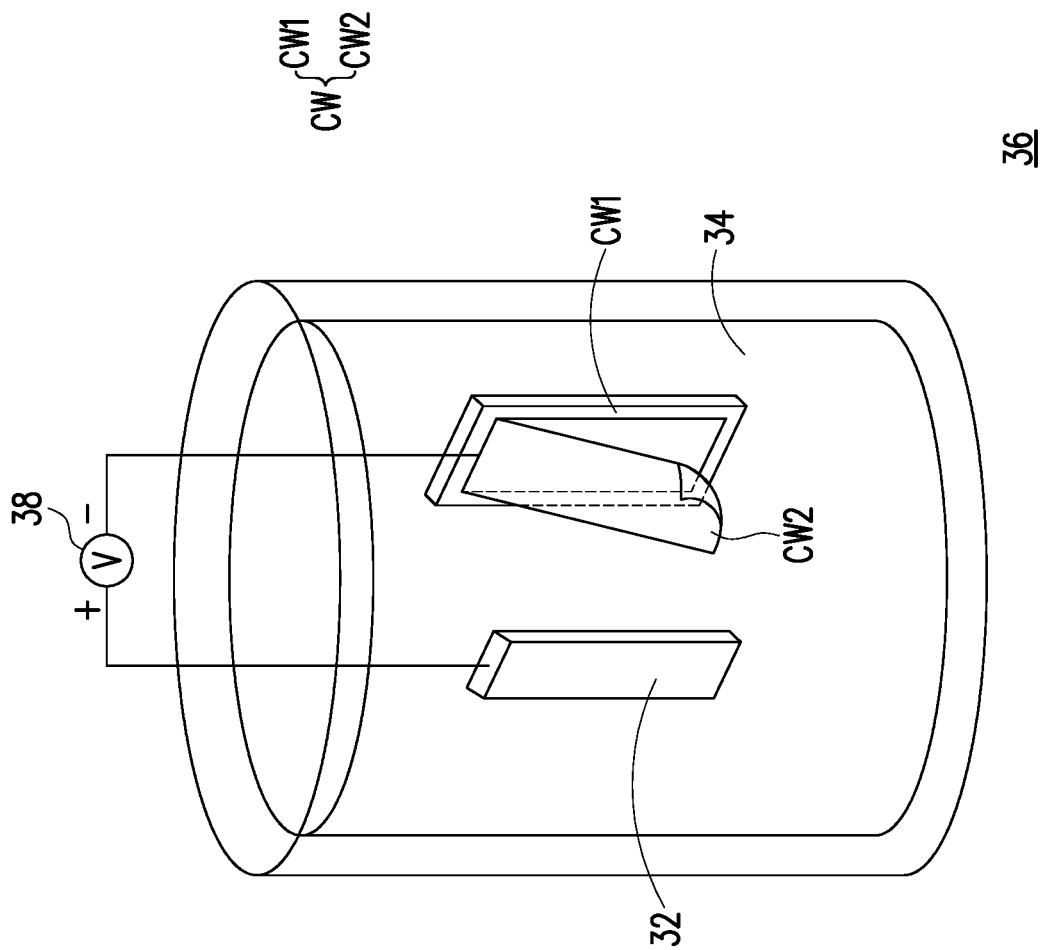
FIG. 3 is a perspective view illustrating a container for performing electrochemical delamination process.

Referring to FIG. 1G and FIG. 2G, an electrochemical delamination process is performed to separate the copper film 100 from the hBNC layer 200. In some embodiments, the electrochemical delamination process is performed by placing the composite wafer CW into a container 36 shown in FIG. 3. FIG. 3 is a perspective view illustrating the container 36 for performing electrochemical delamination process. Referring to FIG. 3, an electrochemical solution 34 is contained in the container 36. In some embodiments, the electrochemical solution 34 serves as an electrolyte. In some embodiments, the electrochemical solution 34 includes an aqueous solution of NaOH, an aqueous solution of K2SO4, aqueous solution of Tetramethyl ammonium Hydroxide (TMAH), or aqueous solutions of other types of chemicals. In some embodiments, the concentration of NaOH in the electrochemical solution 34 is in a range from about 0.2 mol/L to about 5 mol/L. In some embodiments, the composite wafer CW is immersed in the electrochemical solution 34. In some embodiments, a metal plate 32 is used as an anode, and the composite wafer CW is used as a cathode. In some embodiments, metal plate 32 (the anode) is formed of or include platinum or another type of metal. The anode and the cathode are connected to a positive end and a negative end, respectively, of a voltage source 38. The negative end of the voltage source 38 is electrically connected to the copper film 100 in the composite wafer CW.

During the electrochemical delamination process, the electrochemical delamination solution 34 permeates from edges of the composite wafer CW toward center, and hydrogen gas bubbles are generated from the water in the permeated electrochemical delamination solution 34. Furthermore, the hydrogen gas bubbles are generated between the copper film 100 and the hBNC layer 200. Accordingly, the copper film 100 is separated from the hBNC layer 200. A duration of the electrochemical delamination process is related to various factors including the sizes of the composite wafer CW, the applied voltage, and the like. For example, increasing the voltage V may increase the separation rate. However, when the voltage V is too high, the hBNC layer 200 may be delaminated from the protection film PF, thereby causing damage to the hBNC layer 200. On the other hand, when the voltage V is too low, the separation rate is too low. As a result, the composite wafer CW is exposed to the electrochemical delamination solution 34 for an extensive period of time, which would cause damage to the hBNC layer 200. In some embodiments, the voltage V ranges from about 1 V to about 10 V, and may also ranges from about 3 V to about 5 V.

As illustrated in FIG. 1G and FIG. 2G, the electrochemical delamination process results in the separation of composite wafer CW into a first composite wafer part CW1 and a second composite wafer part CW2. The first composite wafer part CW1 includes the substrate SUB and the copper film 100, and the second composite wafer part CW2 includes the hBNC layer 200, the protection film PF, and the thermal release tape TRT. At this stage, since both of the hBNC layer 200 and the protection film PF are thin, the thermal release tape TRT has the function of preventing the second composite wafer part CW2 from folding. In some embodiments, since the substrate SUB in the first composite wafer part CW1 is undamaged, the substrate SUB may be reused. For example, the copper film 100 formed on the substrate SUB can be removed through an etching process, and the resulting substrate SUB can be reused to perform the processes shown in FIG. 1A to FIG. 1G and FIG. 2A to FIG. 2G.

Referring to FIG. 1H and FIG. 2H, the second composite wafer part CW2 is adhered to the wafer W. In some embodiments, the hBNC layer 200 is in physical contact with the wafer W. In some embodiments, the wafer includes a semiconductor material such as silicon, a dielectric material such as silicon oxide, silicon nitride, a conductive material such as nickel, palladium, scandium, titanium, or the like. In some embodiments, the wafer W is a semiconductor substrate, such as a bulk semiconductor substrate, a Semiconductor-On-Insulator (SOI) substrate, or the like, which may be doped (e.g., with a p-type or an n-type dopant) or undoped. In some embodiments, the semiconductor substrate may include silicon, germanium, or a compound semiconductor including silicon carbide, gallium arsenic, gallium phosphide, indium phosphide, indium arsenide, and/or indium antimonide. The semiconductor substrate may also be formed of or include an alloy semiconductor including SiGe, GaAsP, AlInAs, AlGaAs, GaInAs, GaInP, and/or GaInAsP; or combinations thereof. As illustrated in FIG. 1H and FIG. 2H, since the wafer W has a flat top surface, the hBNC layer 200, the protection film PF, and the thermal release tape TRT no longer have stair case profiles after being transferring onto the wafer W. In other words, after being transferred onto the wafer W, the hBNC layer 200, the protection film PF, and the thermal release tape TRT all have flat top surfaces.

Figures 1I, 2I:
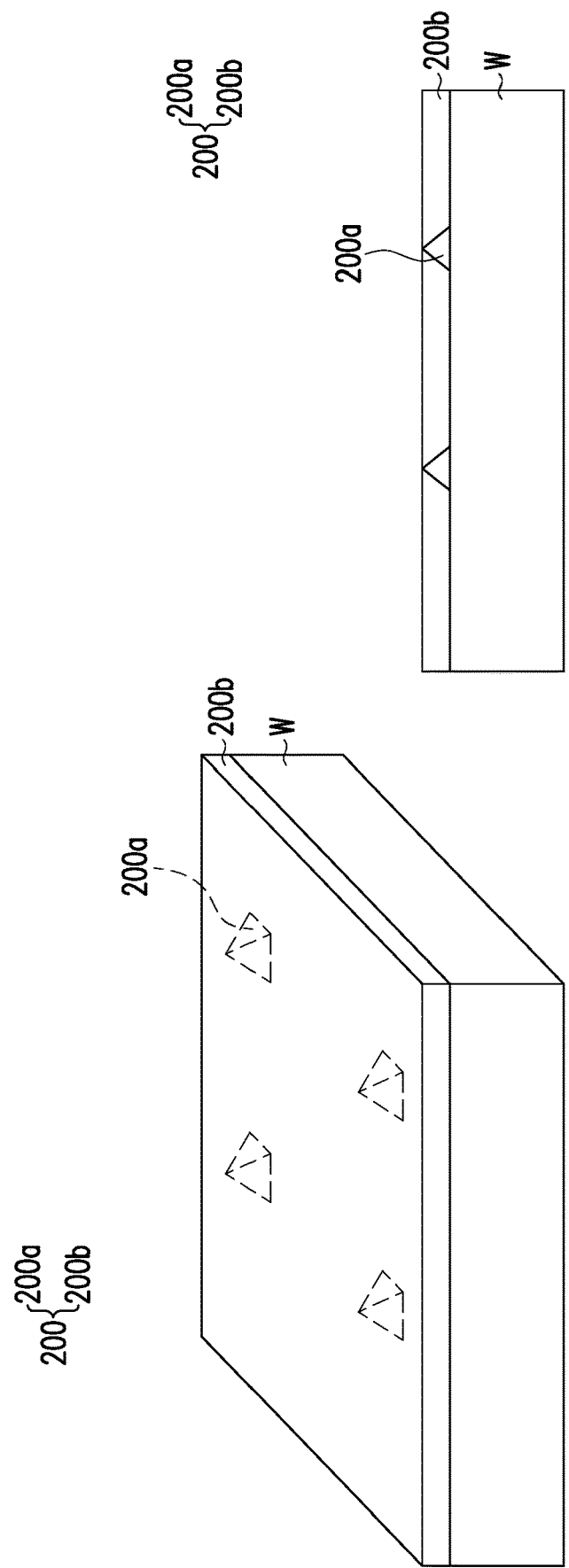

Referring to FIG. 1H to FIG. 1I and FIG. 2H to FIG. 2I, the thermal release tape TRT and the protection film PF are removed. In some embodiments, the thermal release tape TRT is removed by baking the structure shown in FIG. 1I and FIG. 2I. The baking temperature may range from about 160° C. to about 200° C., so that the thermal release tape TRT loses adhesiveness, and hence may be removed from the protection film PF. The baking may be performed by placing the structure as shown in FIG. 1I and FIG. 2I on a hot plate (not shown). After the thermal release tape TRT is removed, an etching process or a dissolving process may be performed on the protection film PF to remove the protection film PF. In certain embodiments in which the protection film PF is formed of PMMA, the protection film PF is removed by immersing the structure in hot acetone for about 30 minutes to about 50 minutes. In some embodiments, the temperature of the hot acetone is in a range from about 30° C. to about 100° C.

After the removal of the protection film PF, the hBNC layer 200 is exposed. It is appreciated that the hBNC layer 200 is a single-crystalline film, regardless of the material and the lattice structure of the underlying material such as the wafer W. This is advantageous over growing an hBNC film (i.e. the hBNC layer 200) on the wafer W because it is impossible to grow a single-crystalline hBNC film from the wafer W. This is due to various limitations such as whether the underlying layer from which the hBNC film is grown is single-crystalline or not, whether the lattice constants of hBNC film and the underlying layer match with each other, and the like.

Figure 4A:
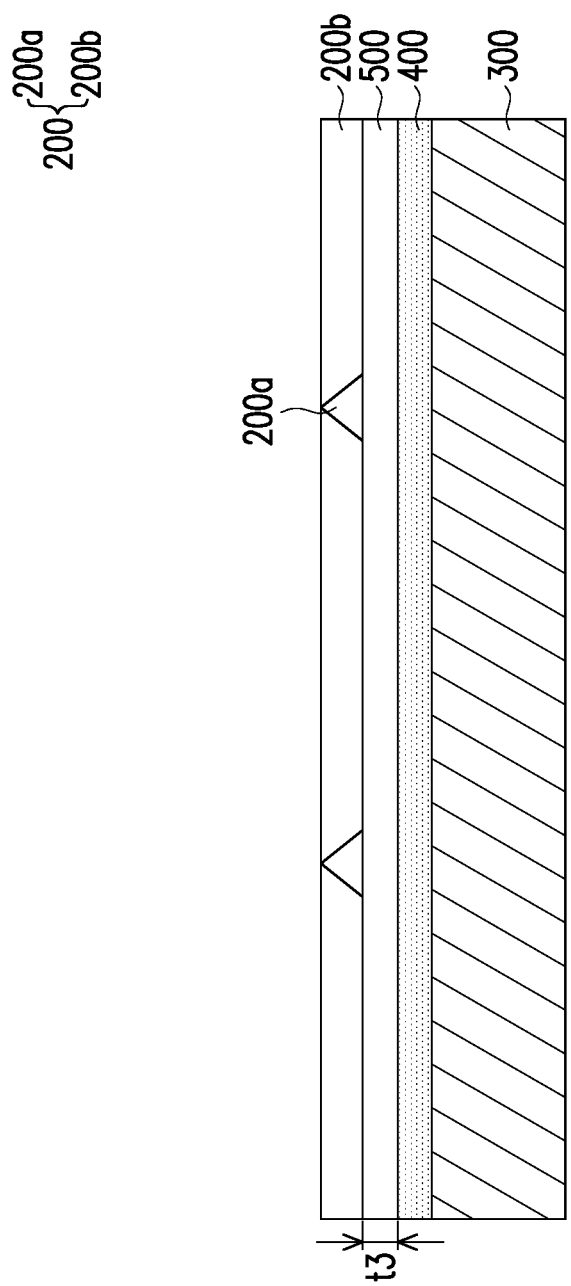
FIG. 4A to FIG. 4G are cross-sectional views illustrating various stages of a method of manufacturing a semiconductor device in accordance with some embodiments of the disclosure.

FIG. 4A to FIG. 4G are cross-sectional views illustrating various stages of a method of manufacturing a semiconductor device 10 in accordance with some embodiments of the disclosure. Referring to FIG. 4A, a first gate electrode 300 is provided. In some embodiments, the first gate electrode 300 includes a metal such as nickel, palladium, scandium, titanium, or alloys thereof. In some embodiments, the first gate electrode 300 is formed through CVD, plasma enhanced chemical vapor deposition (PECVD), atomic layer deposition (ALD), or other suitable methods. As illustrated in FIG. 4A, a first gate dielectric layer 400 is disposed on the first gate electrode 300. In some embodiments, the first gate dielectric layer 400 includes a high-k dielectric material selected from $HfO_2$, $HfSiO_x$, $HfZrO_x$, $Al_2O_3$, $TiO_2$, $LaO_x$, $BaSrTiO_x$, (BST), $PbZr_xTi_yO_z$ (PZT), multi-layers thereof, and/or combinations thereof. Similar to that of the first gate electrode 300, the first gate dielectric layer 400 may be formed through CVD, PECVD, ALD, or other suitable methods.

After the first gate dielectric layer 400 is formed, a first hBN layer 500 is formed on the first gate dielectric layer 400. In some embodiments, the first hBN layer 500 may be formed and transferred by similar manner as that of the hBNC layer 200 in FIG. 1A to FIG. 1D, FIG. 1F to FIG. 1I, FIG. 2A to FIG. 2D, and FIG. 2F to FIG. 2I. For example, the processes shown in FIG. 1A to FIG. 1D and FIG. 2A to FIG. 2D may be performed. However, instead of performing a deposition process with short duration and low precursor flow rate for forming the hBN flakes 200a as in FIG. 1D and FIG. 2D, a deposition process with longer duration and higher precursor flow rate is performed to form the first hBN layer 500 on the copper film 100. For example, the deposition time may range from about 30 minutes to about 180 minutes. In some embodiments, the first hBN layer 500 is formed to be a monolayer. In some embodiments, since the first hBN layer 500 is grown on the single-crystalline copper film 100, with appropriate process conditions for the deposition, the first hBN layer 500 may be formed to have a single-crystalline structure, as deposited. Subsequently, the processes shown in FIG. 1F to FIG. 1I and FIG. 2F to FIG. 2I are performed to transfer the first hBN layer 500 onto the first gate dielectric layer 400 in FIG. 4A. In some embodiments, the first hBN layer 500 is formed to have a thickness t3 ranging from about 3 Å to about 10 Å.

As illustrated in FIG. 4A, the hBNC layer 200 is formed on the first hBN layer 500. In some embodiments, the first gate electrode 300, the first gate dielectric layer 400, and the first hBN layer 500 may be included in the wafer W in FIG. 1I and FIG. 2I. In other words, the hBNC layer 200 in FIG. 4A may be formed and transferred onto the first hBN layer 500 through the processes shown in FIG. 1A to FIG. 1I and FIG. 2A to FIG. 2I, so the detailed description thereof is omitted herein. In some embodiments, the hBNC layer 200 can function as a channel layer for the subsequently formed transistor T1. As mentioned above, since the hBNC layer 200 includes the graphene layer 200b being modified by the hBN flakes 200a, the hBNC layer 200 has a suitable band gap and carrier mobility for the subsequently formed transistor T1.

Figure 4B:
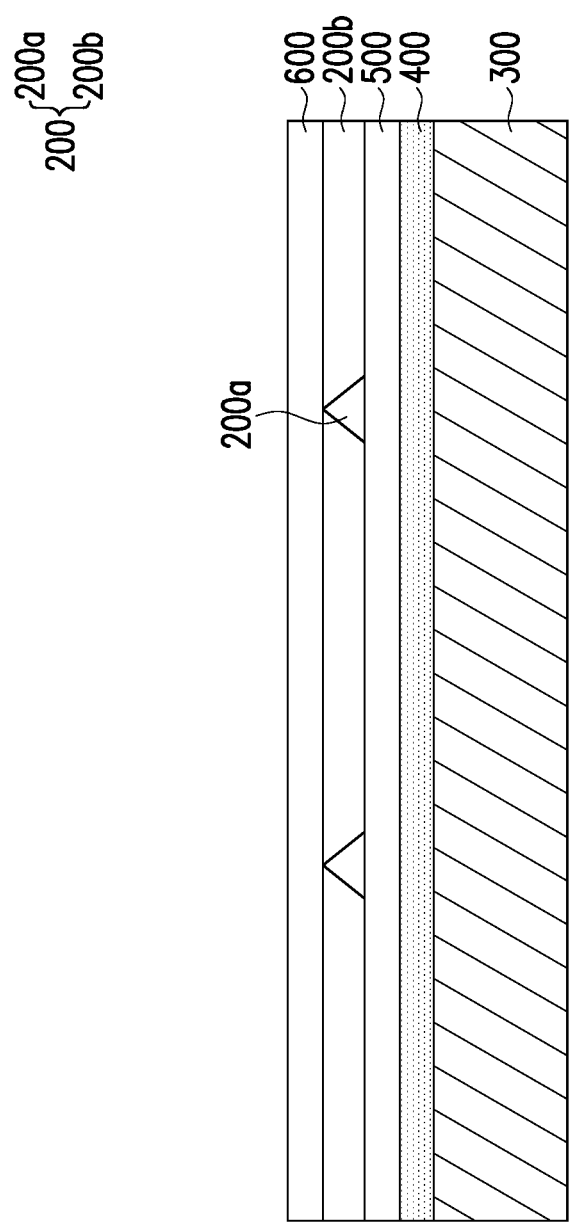

Referring to FIG. 4B, a second hBN layer 600 is formed on the hBNC layer 200. For example, the second hBN layer 600 is formed such that the first hBN layer 500 and the second hBN layer 600 are disposed on two opposite sides of the hBNC layer 200. That is, the hBNC layer 200 is sandwiched between the first hBN layer 500 and the second hBN layer 600. In some embodiments, the formation method and the transfer method of the second hBN layer 600 are similar to that of the first hBN layer 500, so the detailed description thereof is omitted herein.

In some embodiments, both of the first hBN layer 500 and the second hBN layer 600 have single-crystalline structure. In some embodiments, the first hBN layer 500 and the second hBN layer 600 with single-crystalline are advantageous for the subsequently formed transistor T1. For example, if the first hBN layer 500 and the second hBN layer 600 in the transistor T1 have polycrystalline structure, when carriers (such as electrons) flow in the hBNC layer 200 between the first hBN layer 500 and the second hBN layer 600, carrier scattering occurs at the boundary of the grains of the polycrystalline structure of the first hBN layer 500 and the second hBN layer 600, causing the degradation of the performance of the resulting transistor T1. Accordingly, having a single-crystalline structure is beneficial for avoiding the foregoing problem in the resulting transistor T1.

In some embodiments, the first hBN layer 500, the hBNC layer 200, and the second hBN layer 600 are transferred in a wafer form. As such, the first hBN layer 500, the hBNC layer 200, and the second hBN layer 600 may be patterned to suitable size for forming the transistor T1. It should be noted that the first hBN layer 500, the hBNC layer 200, and the second hBN layer 600 illustrated in FIG. 4A to FIG. 4G represent the remaining patterned portions for forming the transistor T1.

Figure 4C:
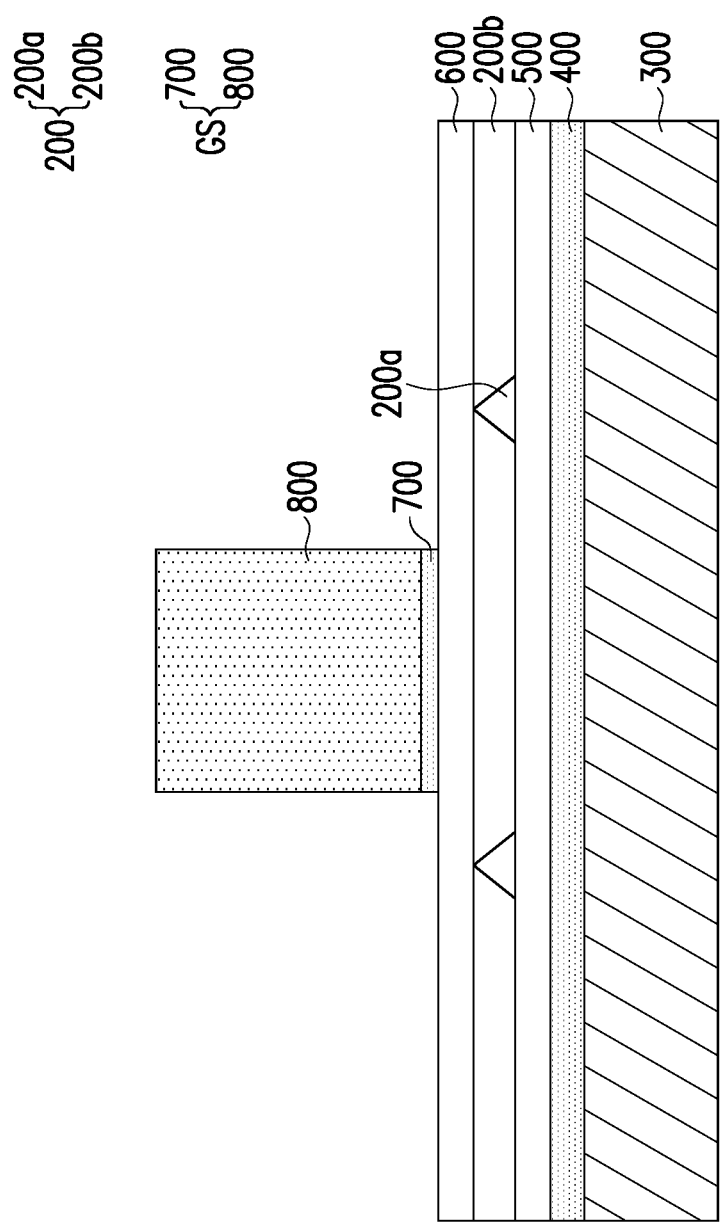

Referring to FIG. 4C, a first gate stack GS is formed on the second hBN layer 600. For example, the second hBN layer 600 is located between the first gate stack GS and the hBNC layer 200. In some embodiments, the first gate stack GS includes a gate dielectric layer 700 and a gate electrode 800 disposed on the gate dielectric layer 700. In some embodiments, the first gate stack GS is a dummy gate stack, which will be replaced with a replacement gate stack in the subsequent processes. In some embodiments, the gate dielectric layer 700 includes silicon oxide and the gate electrode 800 includes polysilicon. However, the disclosure is not limited thereto. When the first gate stack GS is not a dummy gate stack (i.e. the first gate stack GS may act as the functional gate stack of the subsequently formed transistor T1), the gate dielectric layer 700 may include silicon oxide and a high-k dielectric layer, and the gate electrode 800 may include polysilicon, a metal, or a metal compound. In some embodiments, the first gate stack GS is formed by sequentially depositing a gate dielectric material layer (not shown) and a gate electrode material layer (not shown) on the second hBN layer 600 through CVD, PECVD, ALD, or other suitable methods, followed by patterning these layers to form the gate dielectric layer 700 and the gate electrode 800. In some embodiments, the patterning process is performed without patterning second hBN layer 600, so that the second hBN layer 600 may be used as a capping layer to protect the underlying hBNC layer 200 from the damage incurred in the various processes involved, such as cleaning processes.

Figure 4D:
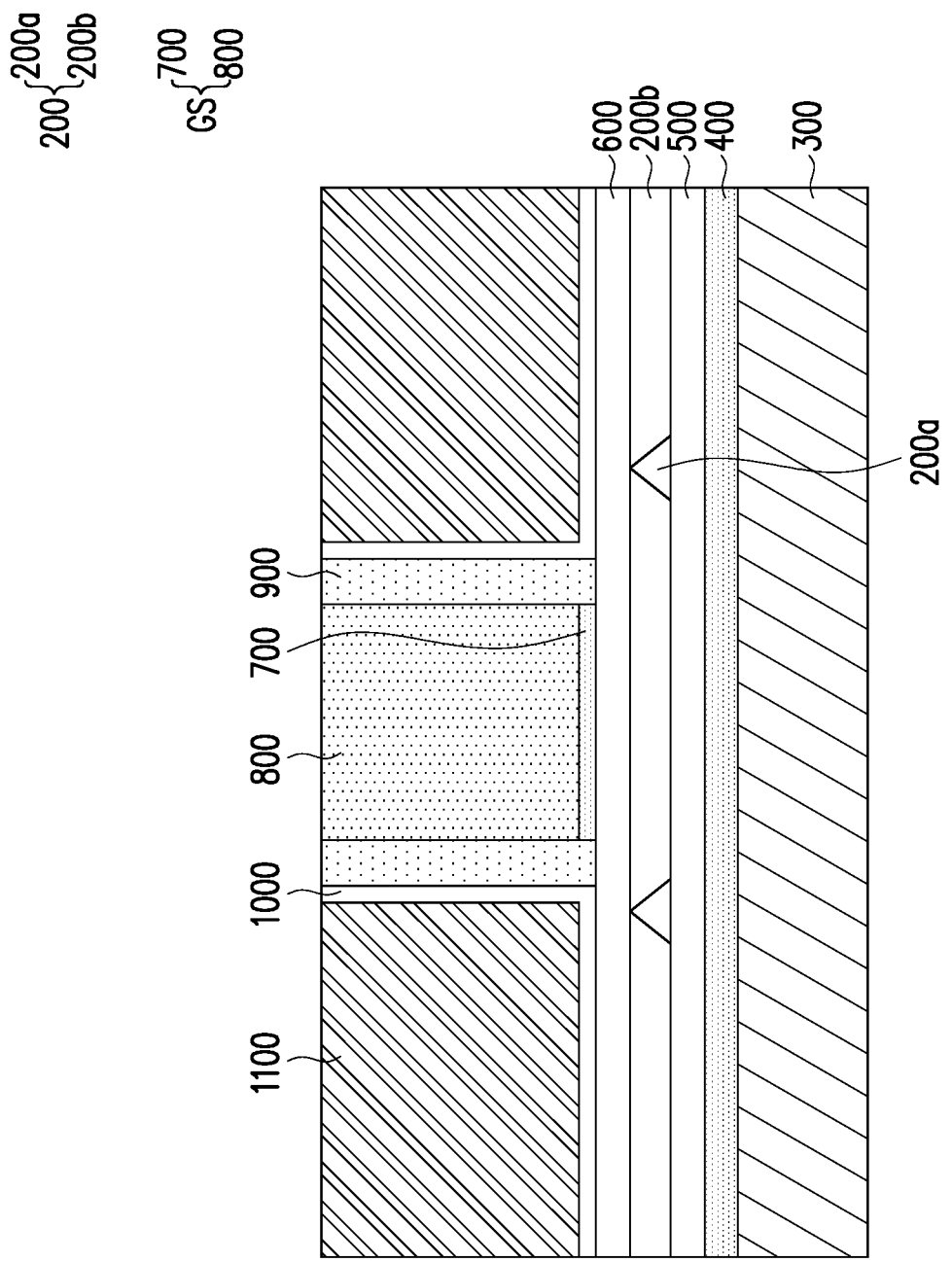

Referring to FIG. 4D, a pair of spacers 900 is formed aside the first gate stack GS. In other words, the spacers 900 covers sidewalls of the first gate stack GS. In some embodiments, the spacers 900 are formed of silicon oxide, silicon nitride, silicon oxynitride, composite layers thereof, and/or combinations thereof. The spacers 900 may have a multi-layer structure which includes one or more liner layers. The liner layer includes a dielectric material such as silicon oxide, silicon nitride, and/or other suitable materials. The formation of the spacers 900 can be achieved by depositing suitable dielectric material and anisotropically etching off the dielectric material.

As illustrated in FIG. 4D, an etch stop layer 1000 is formed over the second hBN layer 600 and the spacers 900. In some embodiments, the etch stop layer 1000 includes silicon carbide, silicon nitride, silicon oxynitride, silicon carbo-nitride, or multi-layers thereof. In some embodiments, the etch stop layer 1000 is deposited using CVD, high density plasma (HDP) CVD, sub-atmospheric CVD (SACVD), molecular layer deposition (MLD), or other suitable methods. After the etch stop layer 1000 is formed, a dielectric layer 1100 is formed on the etch stop layer 1000. In some embodiments, the dielectric layer 1100 is referred to as "interlayer dielectric layer (ILD)." In some embodiments, the dielectric layer 1100 includes silicon oxide, phospho silicate glass (PSG), borosilicate glass (BSG), boron-doped phospho silicate glass (BPSG), fluorine-doped silicate glass (FSG), or the like. The dielectric layer 1100 may be formed using spin coating, Flowable Chemical Vapor Deposition (FCVD), PECVD, LPCVD, or the like.

Figure 4E:
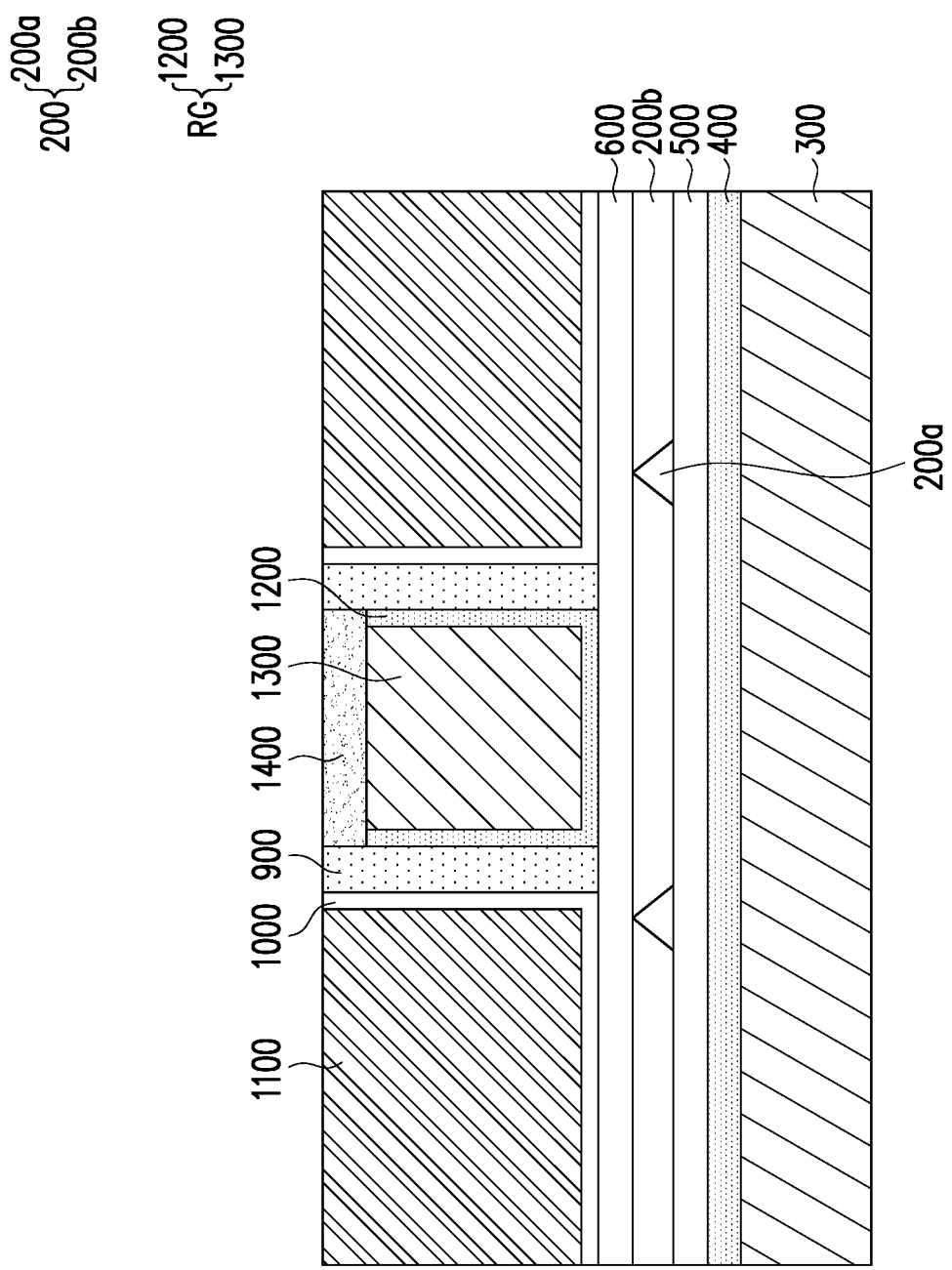

Referring to FIG. 4D and FIG. 4E, a gate replacement process is performed. For example, the first gate stack GS in FIG. 4D is replaced with a second gate stack RG in FIG. 4E. In some embodiments, the gate replacement process includes performing etching processes to remove the first gate stack GS, depositing a conformal gate dielectric layer (not shown) extending into the trench left by the removed first gate stack GS, deposition one or a plurality of conductive layers (not shown) on the conformal gate dielectric layer, and performing a planarization process to remove excess portions of the conformal gate dielectric layer and the conductive layers. The remaining gate dielectric layer forms a second gate dielectric layer 1200 and the remaining conductive layers form a second gate electrode 1300. The second gate dielectric layer 1200 and the second gate electrode 1300 then may be collectively referred to as the second gate stack RG. In some embodiments, the second gate dielectric layer 1200 includes a high-k dielectric material selected from $HfO_2$, $HfSiO_x$, $HfZrO_x$, $Al_2O_3$, $TiO_2$, $LaO_x$, $BaSrTiO_x$, (BST), $PbZr_xTi_yO$, (PZT), multi-layers thereof, and/or combinations thereof. On the other hand, the second gate electrode 1300 includes a metal such as nickel, palladium, scandium, titanium, or alloys thereof. In some embodiments, the second gate dielectric layer 1200 is formed through CVD, PECVD, ALD, or other suitable methods. Similarly, the second gate electrode 1300 is also formed through CVD, PECVD, ALD, or other suitable methods.

It should be noted that the gate replacement process is performed when the first gate stack GS is a dummy gate. However, when the first gate stack GS is not a dummy gate, the gate replacement process may be omitted.

In some embodiments, after the gate replacement process, the second gate stack RG is recessed from top to form a recess. Subsequently, a hard mask layer 1400 is filled into the recess. In some embodiments, the hard mask layer 1400 includes titanium nitride (TiN) or the like. As illustrated in FIG. 4E, a top surface of the hard mask layer 1400 is substantially coplanar with top surfaces of the spacers 900, a top surface of the etch stop layer 1000, and a top surface of the dielectric layer 1100.

Figure 4F:
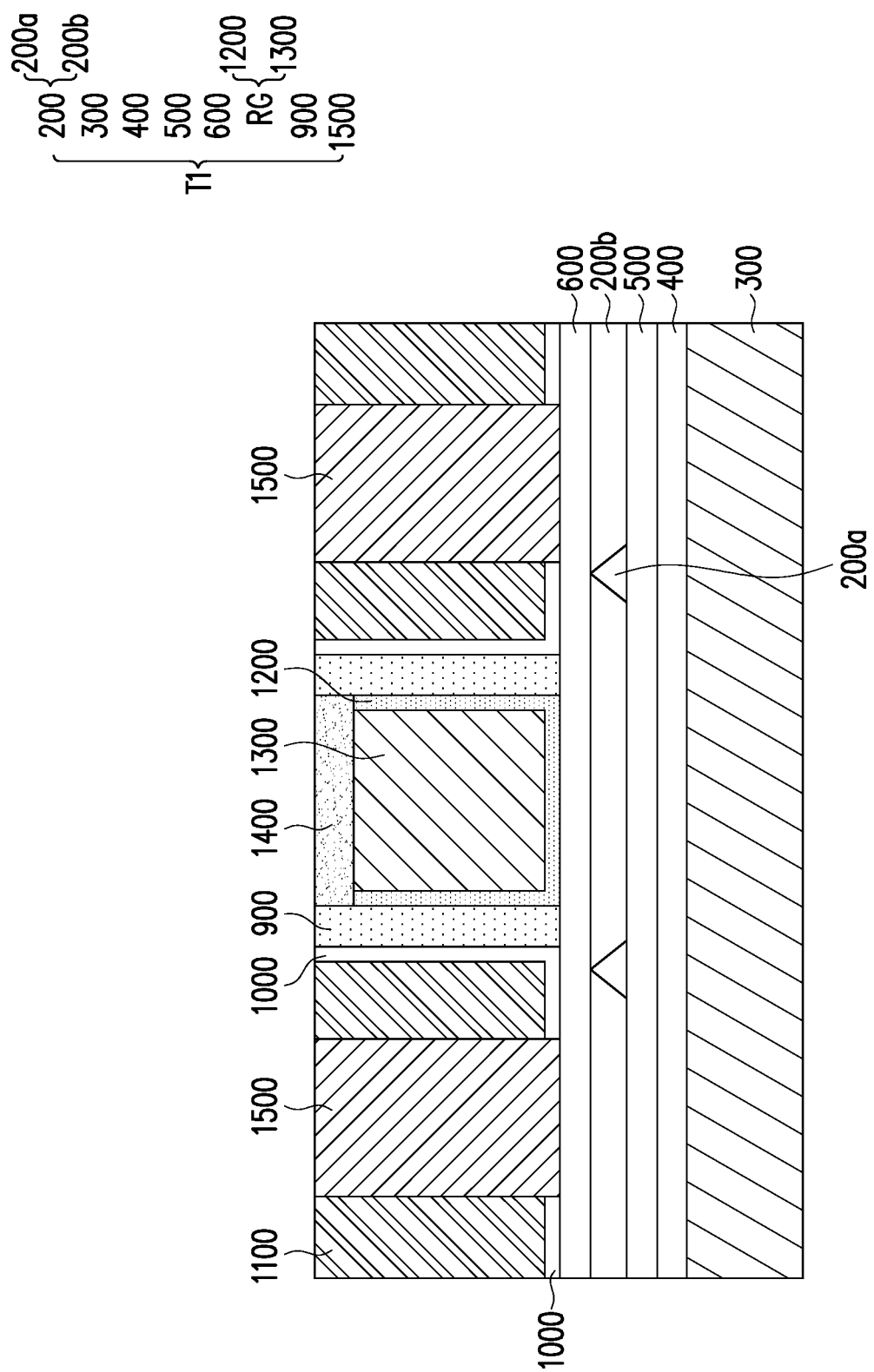

Referring to FIG. 4F, source/drain regions 1500 are formed to penetrate through the dielectric layer 1100 and the etch stop layer 1000. In some embodiments, the source/drain regions 1500 are formed aside the second gate stack RG. In some embodiments, the source/drain regions 1500 include a conductive material selected from tungsten, cobalt, palladium, silver, nickel, gold, titanium, gadolinium, or alloys thereof. The source/drain regions 1500 may or may not include a barrier layer formed of titanium, titanium nitride, tantalum, tantalum nitride, or the like. In some embodiments, the source/drain regions 1500 are formed by the following steps. First, the dielectric layer 1100 and the etch stop layer 1100 (and possibly underlying layers) are partially removed through an etching process to form openings (not shown). Thereafter, a conductive material (not shown) is filled into the openings. Subsequently, a planarization process is performed to remove excess portions of the conductive material over the dielectric layer 1100, so as to form the source/drain regions 1500. In some embodiments, the planarization process includes a chemical mechanical polishing (CMP) process, a mechanical grinding process, or the like.

In some embodiments, the source/drain regions 1500 have bottoms landing on, and hence in contact with, a top surface of second hBN layer 600. In other words, the source/drain regions 1500 are physically separated from the hBNC layer 200 by the second hBN layer 600. However, since the second hBN layer 600 is very thin, for example, in the scale of a few nanometers or thinner, carriers may tunnel through the second hBN layer 600 to reach the hBNC layer 200. Accordingly, although there is the second hBN layer 600 (which is a dielectric layer) between the source/drain regions 1500 and the hBNC layer 200, carriers (such as electrons) may flow from the source region 1500 into the hBNC layer 200 and then into the drain region 1500 through tunneling. However, the disclosure is not limited thereto. In some alternative embodiments, the source/drain regions 1500 may penetrate through the dielectric layer 1100, the etch stop layer 1000, and the second hBN layer 600 to be in physical contact with a top surface of hBNC layer 200.

After the source/drain regions 1500 are formed, the manufacturing process for a transistor T1 is substantially completed. The transistor T1 includes the first gate electrode 300, the first gate dielectric layer 400, the first hBN layer 500, the hBNC layer 200, the second hBN layer 600, the second gate stack RG, the spacers 900, and the source/drain regions 1500. In some embodiments, since the transistor T1 includes two gates (the first gate electrode 300 and the second gate electrode 1300), the transistor T1 may be referred to as a "dual-gate transistor." As mentioned above, the hBNC layer 200 includes the hBN flakes 200a and the graphene layer 200b. As such, the contact region between the source/drain regions 1500 and the hBNC layer 200 is a metal-graphene junction. Such junction has a small contact resistance (<100 Ωµm) and can benefit from Dirac source in subthreshold swing (SS), thereby allowing the transistor T1 to have excellent performance.

Figure 4G:
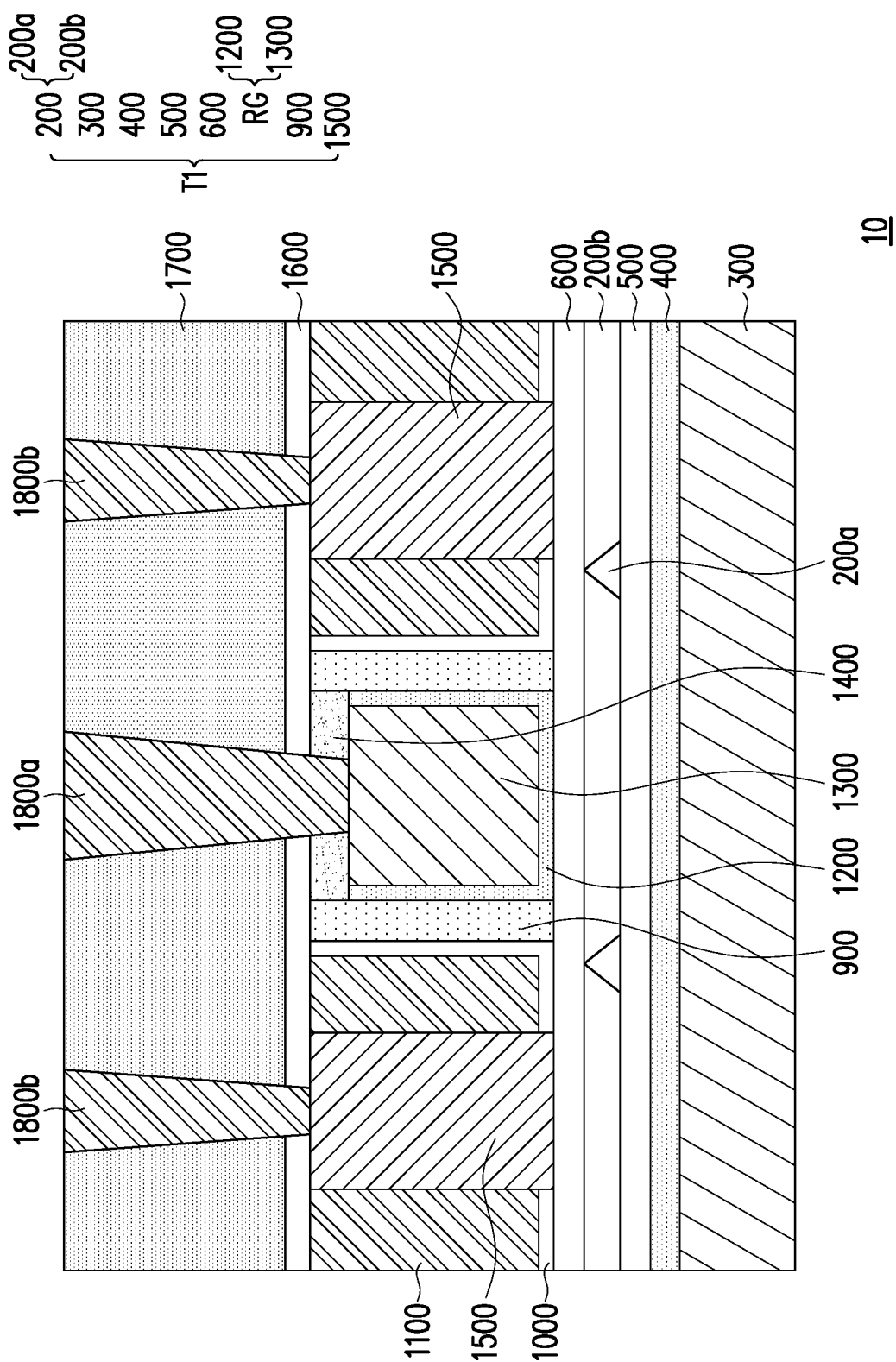

Referring to FIG. 4G, a contact etch stop layer (CESL) 1600 is formed on the spacers 900, the etch stop layer 1000, the dielectric layer 1100, the hard mask layer 1400, and the source/drain regions 1500. After the CESL 1600 is formed, a dielectric layer 1700 is formed on the CESL 1600. In some embodiments, materials and formation methods of the CESL 1600 and the dielectric layer 1700 are respectively similar to that of the etch stop layer 1000 and the dielectric layer 1100, so the detailed descriptions thereof are omitted herein. Thereafter, a gate contact plug 1800a and a plurality of source/drain contact plugs 1800b are formed to obtain the semiconductor device 10. In some embodiments, the gate contact plug 1800a and the source/drain contact plugs 1800b are electrically connected to the second gate electrode 1300 and the source/drain regions 1500, respectively. In some embodiments, the gate contact plug 1800a and the source/drain contact plugs 1800b are formed of a conductive material selected from tungsten, aluminum, copper, titanium, tantalum, titanium nitride, tantalum nitride, alloys therefore, and/or multi-layers thereof. In some embodiments, the gate contact plug 1800a and the source/drain contact plugs 1800b are formed by the following steps. First, the dielectric layer 1700, the CESL 1600, and optionally the hard mask layer 1400 (for forming the gate contact plug 1800a) are partially removed through an etching process to form openings (not shown). Thereafter, a conductive material (not shown) is filled into the openings. Subsequently, a planarization process is performed to remove excess portions of the conductive material over the dielectric layer 1700, so as to form the gate contact plug 1800a and the source/drain contact plugs 1800b. As illustrated in FIG. 4G, the gate contact plug 1800a penetrates through the dielectric layer 1700, the CESL 1600, and the hard mask layer 1400 to be in physical contact with the second gate electrode 1300 of the second gate stack RG. On the other hand, the source/drain contact plugs 1800b penetrate through the dielectric layer 1700 and the CESL 1600 to be in physical contact with the source/drain regions 1500.

Figure 5A:
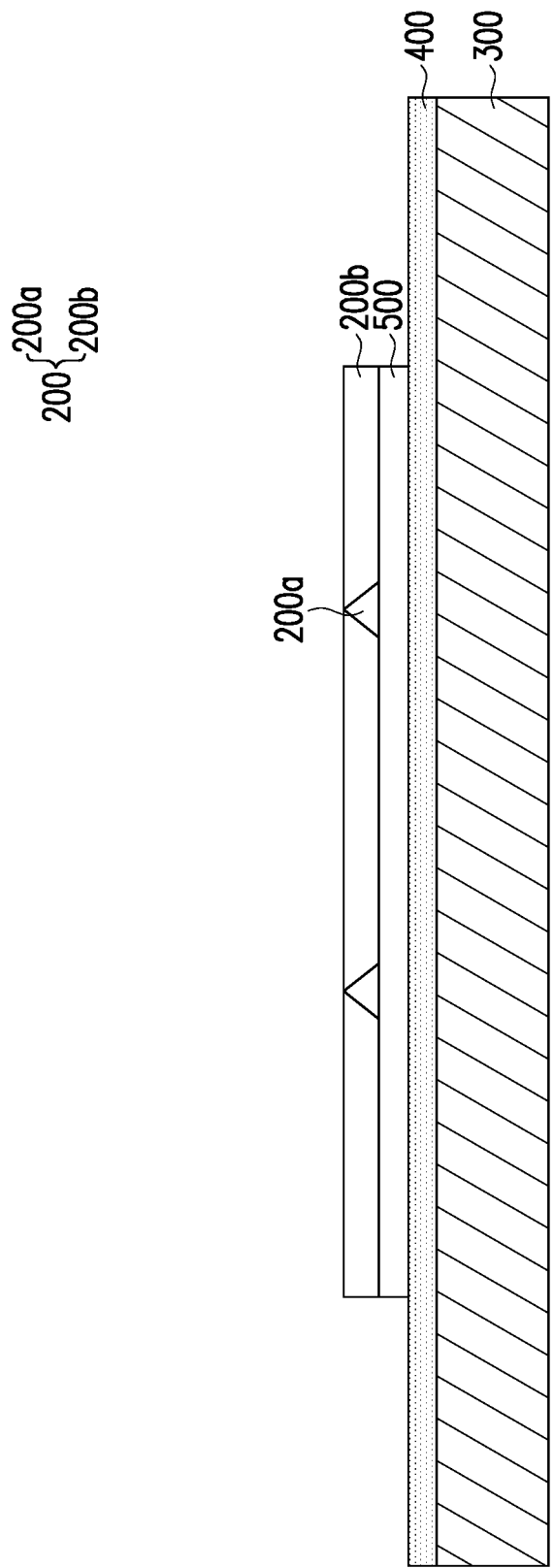

FIG. 5A to FIG. 5G are cross-sectional views illustrating various stages of a method of manufacturing a semiconductor device 20 in accordance with some alternative embodiments of the disclosure. Referring to FIG. 5A, a first gate electrode 300 is provided. Thereafter, a first gate dielectric layer 400, a first hBN layer 500, and a hBNC layer 200 are sequentially formed on the first gate electrode 300. The first gate electrode 300, the first gate dielectric layer 400, the first hBN layer 500, and the hBNC layer 200 in FIG. 5A are respectively similar to the first gate electrode 300, the first gate dielectric layer 400, the first hBN layer 500, and the hBNC layer 200 in FIG. 4A, so the detailed descriptions thereof are omitted herein. As illustrated in FIG. 5A, the first gate electrode 300 and the first gate dielectric layer 400 are larger than the first hBN layer 500 and the hBNC layer 200. For example, from a top view, areas occupied by the first gate electrode 300 and the first gate dielectric layer 400 are larger than areas occupied by the first hBN layer 500 and the hBNC layer 200. In some embodiments, sidewalls of the first hBN layer 500 are aligned with sidewalls of the hBNC layer 200.

Figure 5B:
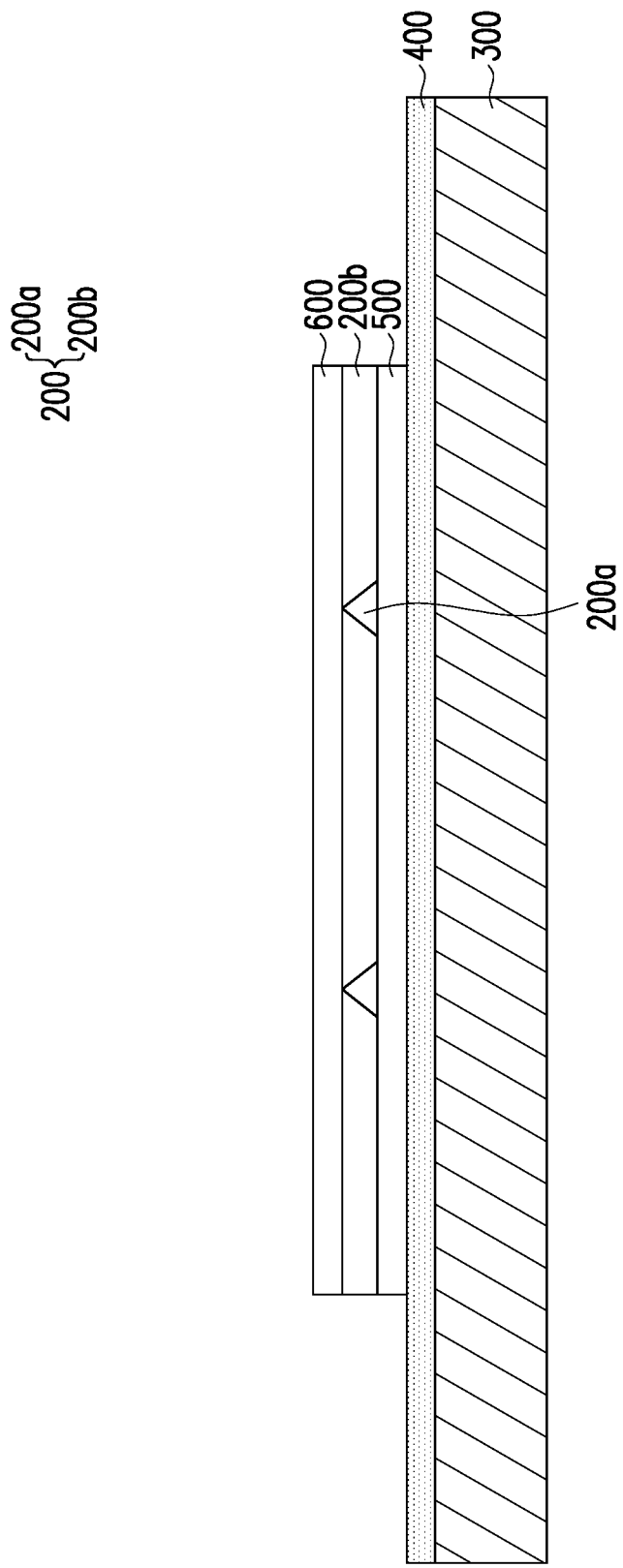

Referring to FIG. 5B, a second hBN layer 600 is formed on the hBNC layer 200. The second hBN layer 600 in FIG. 5B is similar to the second hBN layer 600 in FIG. 4B, so the detailed description thereof is omitted herein. As illustrated in FIG. 5B, sidewalls of the second hBN layer 600 are aligned with sidewalls of the hBNC layer 200 and sidewalls of the first hBN layer 500.

Figure 5C:
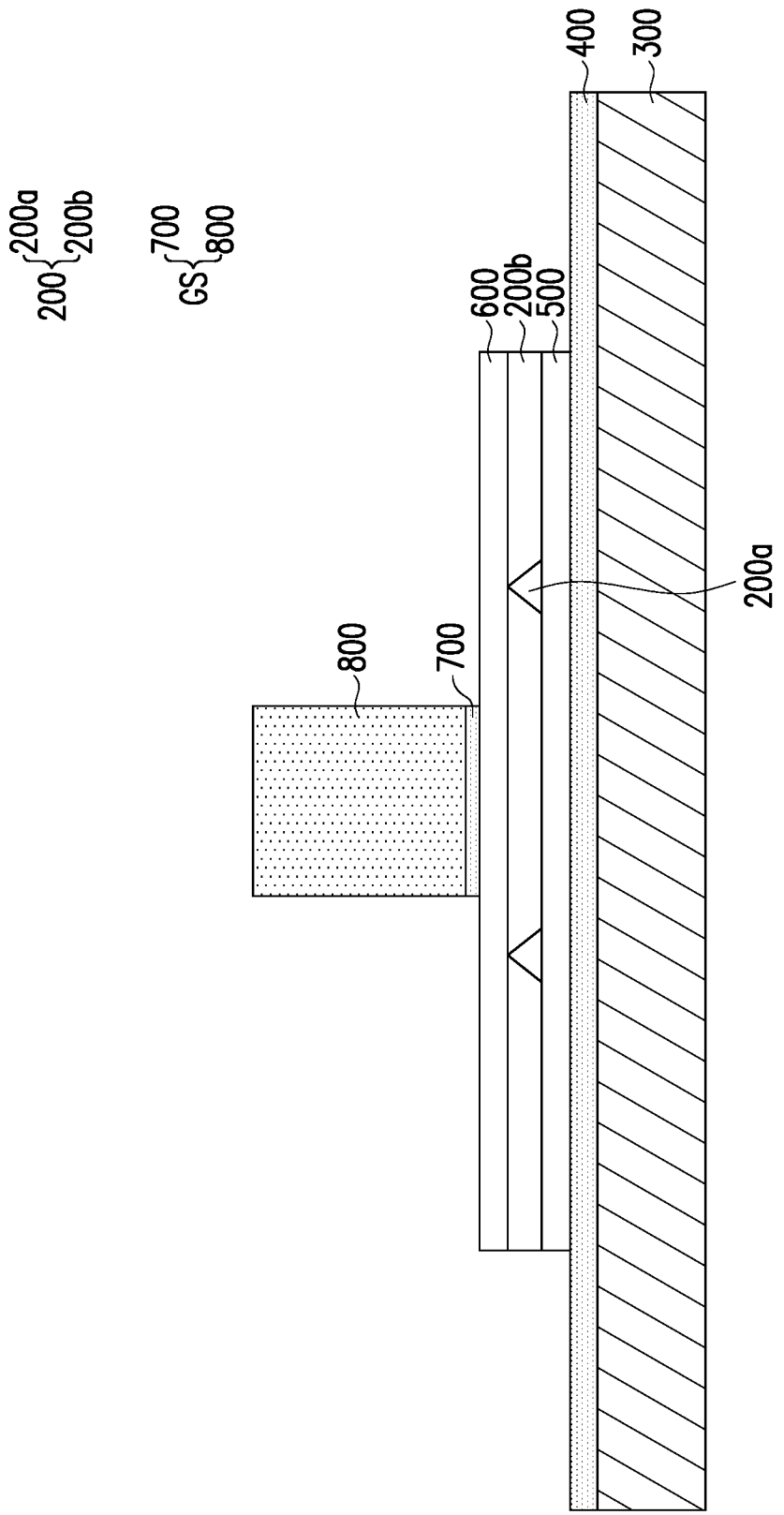

Referring to FIG. 5C, a first gate stack GS is formed on the second hBN layer 600. The first gate stack GS in FIG. 5C is similar to the first gate stack GS in FIG. 4C, so the detailed description thereof is omitted herein.

Referring to FIG. 5D, a pair of spacers 900 is formed aside the first gate stack GS. In addition, an etch stop layer 1000 and a dielectric layer 1100 are formed over the second hBN layer 600 and the spacers 900. The spacers 900, the etch stop layer 1000, and the dielectric layer 1100 in FIG. 5D are respectively similar to the spacers 900, the etch stop layer 1000, and the dielectric layer 1100 in FIG. 4D, so the detailed descriptions thereof are omitted herein. As illustrated in FIG. 5D, the etch stop layer 1000 covers sidewalls of the spacers 900, the exposed top surface of the second hBN layer 600, sidewalls of the second hBN layer 600, sidewalls of the hBNC layer 200, sidewalls of the first hBN layer 500, and the exposed top surface of the first gate dielectric layer 400.

Figure 5E:
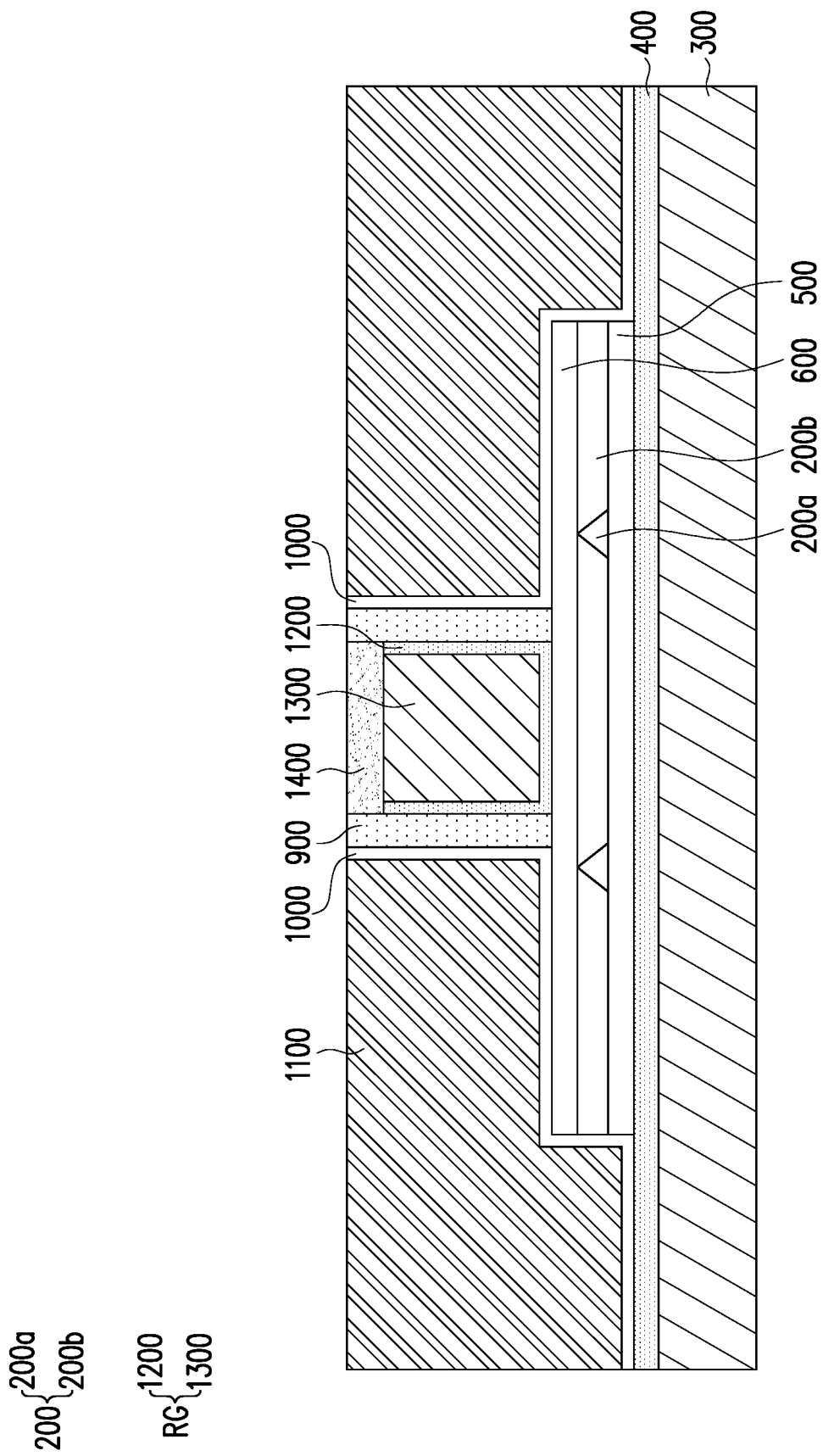

Referring to FIG. 5D and FIG. 5E, a gate replacement process is performed to replace the first gate stack GS in FIG. 5D with the second gate stack RG in FIG. 5E. The gate replacement process in FIG. 5D and FIG. 5E is similar to the gate replacement process described in FIG. 4D and FIG. 4E, so the detailed description thereof is omitted herein.

Figure 5F:
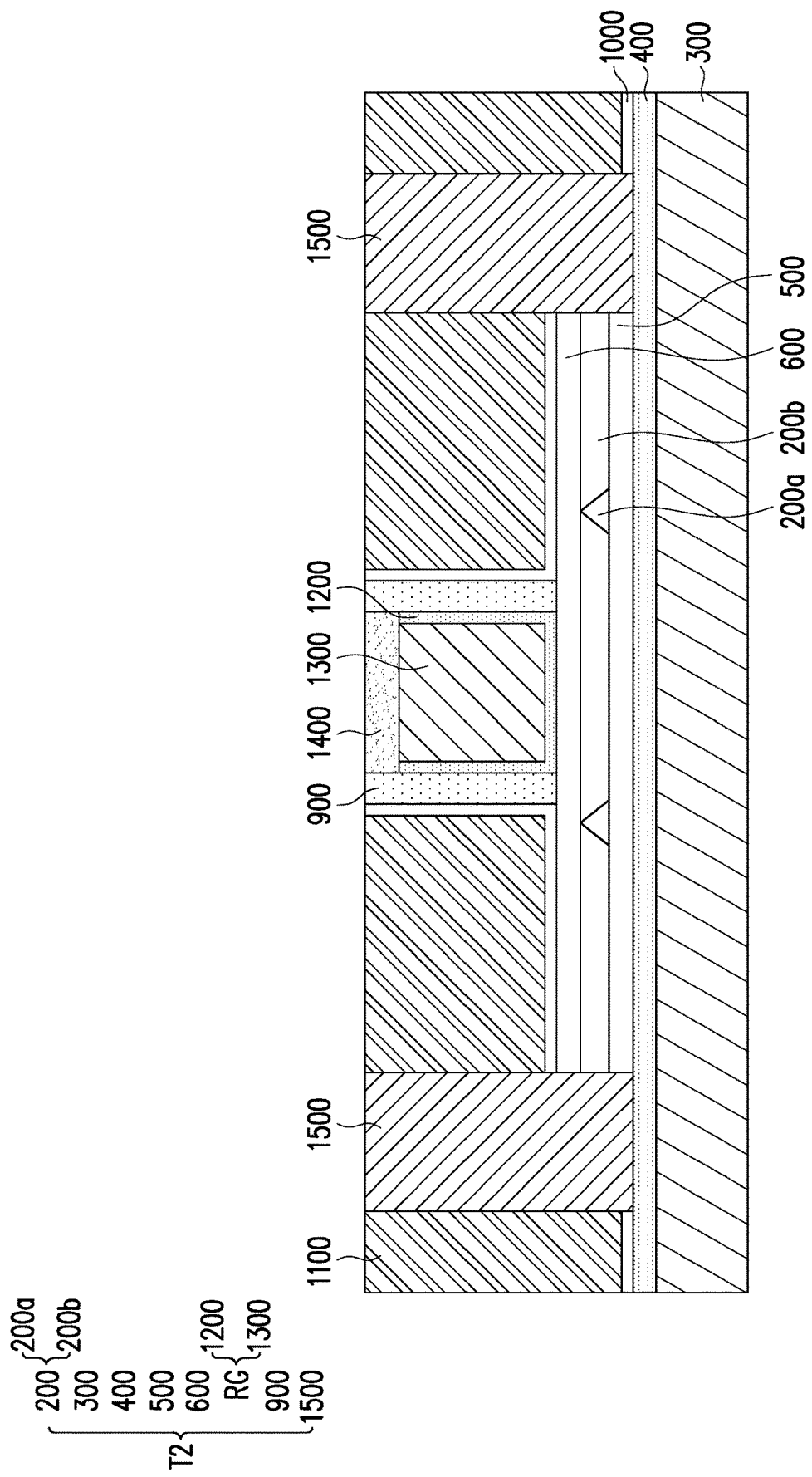

Referring to FIG. 5F, source/drain regions 1500 are formed to penetrate through the dielectric layer 1100 and the etch stop layer 1000. The source/drain regions 1500 in FIG. 5F are similar to the source/drain regions 1500 in FIG. 4F, so the detailed description thereof is omitted herein. As illustrated in FIG. 5F, the source/drain regions 1500 are in physical contact with sidewalls of the first hBN layer 500, sidewalls of the hBNC layer 200, and sidewalls of the second hBN layer 600. In other words, side contacts are made between the sidewalls of the source/drain regions 1500 and sidewalls of the hBNC layer 200. As such, carriers (such as electrons) may flow from the sidewall of the source region 1500 into the sidewall of the hBNC layer 200, flow through the hBNC layer 200, and flows from another sidewall of the hBNC layer 200 into the sidewall of the drain region 1500.

After the source/drain regions 1500 are formed, the manufacturing process for a transistor T2 is substantially completed. The transistor T2 includes the first gate electrode 300, the first gate dielectric layer 400, the first hBN layer 500, the hBNC layer 200, the second hBN layer 600, the second gate stack RG, the spacers 900, and the source/drain regions 1500. In some embodiments, since the transistor T2 includes two gates (the first gate electrode 300 and the second gate electrode 1300), the transistor T2 may be referred to as a "dual-gate transistor." As mentioned above, the hBNC layer 200 includes the hBN flakes 200a and the graphene layer 200b. As such, the contact region between the source/drain regions 1500 and the hBNC layer 200 is a metal-graphene junction. Such junction has a small contact resistance (<100 Ωµm) and can benefit from Dirac source in subthreshold swing (SS), thereby allowing the transistor T2 to have excellent performance.

Figure 5G:
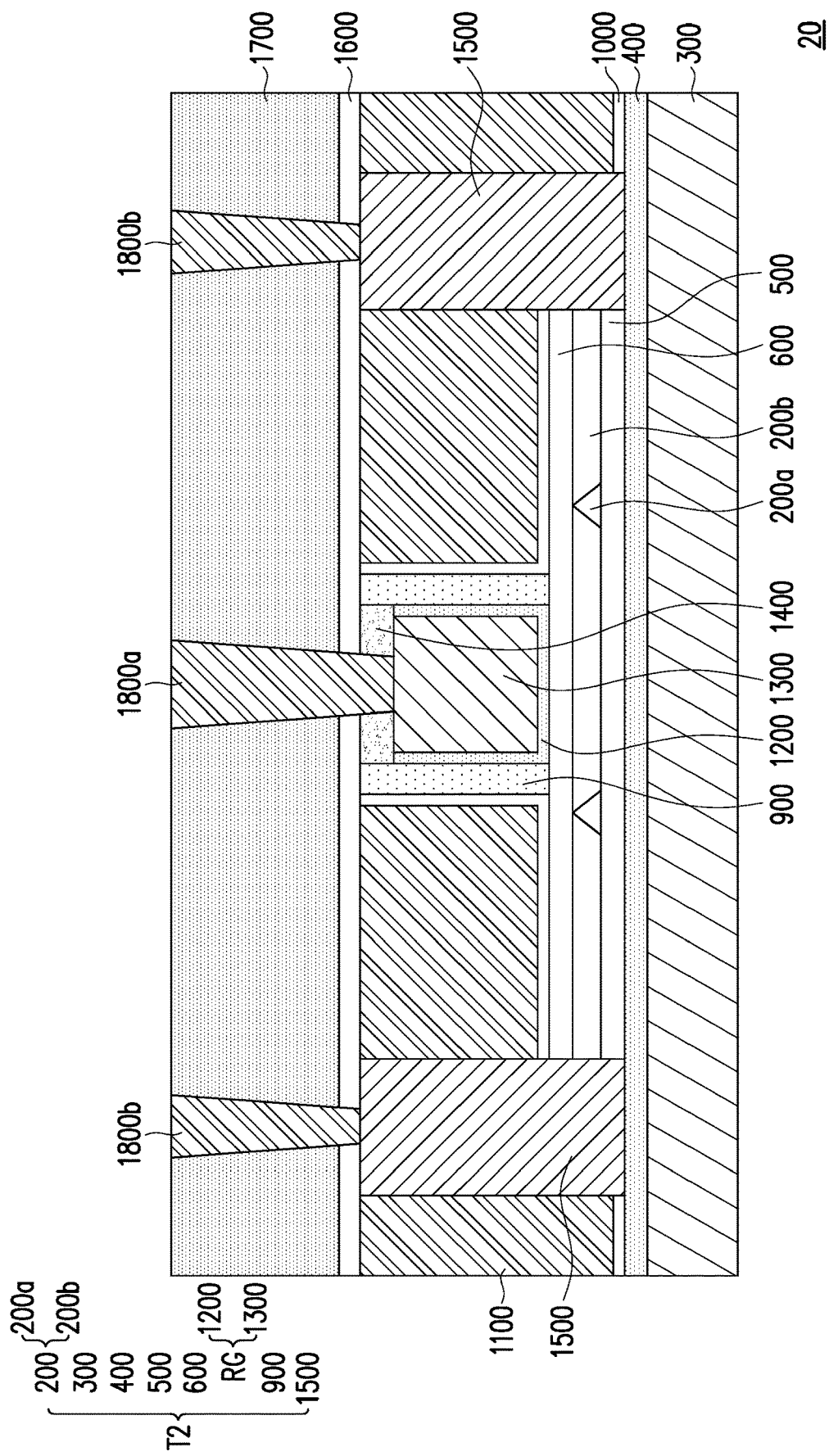

Referring to FIG. 5G, a CESL 1600, a dielectric layer 1700, a gate contact plug 1800a, and a plurality of source/drain contact plugs 1800b are formed to obtain the semiconductor device 20. The CESL 1600, the dielectric layer 1700, the gate contact plug 1800a, and the source/drain contact plugs 1800b in FIG. 5G are respectively similar to the ESL 1600, the dielectric layer 1700, the gate contact plug 1800a, and the source/drain contact plugs 1800b in FIG. 4G, so the detailed descriptions thereof are omitted herein.

In accordance with some embodiments of the disclosure, a transistor includes a channel layer, a gate stack, and source/drain regions. The channel layer includes a graphene layer and hexagonal boron nitride (hBN) flakes dispersed in the graphene layer. Orientations of the hBN flakes are substantially aligned. The gate stack is over the channel layer. The source/drain regions are aside the gate stack.

In accordance with some embodiments of the disclosure, a manufacturing method of a hBNC includes at least the following steps. A polycrystalline copper film is deposited on a substrate. The polycrystalline copper film is converted into a single-crystalline copper film by performing a thermal annealing process. A first process gas is provided on the single-crystalline copper film to form hexagonal boron nitride (hBN) flakes on the single-crystalline copper film. A second process gas is provided on the single-crystalline copper film to form a graphene layer filling a space between the hBN flakes.

In accordance with some embodiments of the disclosure, a manufacturing method of a semiconductor device includes at least the following steps. A copper film is deposited on a substrate. A thermal annealing process is performed on the copper film. Hexagonal boron nitride (hBN) flakes are deposited onto the copper film. A graphene layer is deposited on the copper film to wrap around the hBN flakes, so as to form a hBNC layer. The hBNC layer is transferred onto a wafer. A gate stack is formed over the hBNC layer. Source/drain regions are formed aside the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a hBNC layer, comprising:
   depositing a polycrystalline copper film on a substrate;
   converting the polycrystalline copper film into a single-crystalline copper film by performing a thermal annealing process;
   providing a first process gas on the single-crystalline copper film to form hexagonal boron nitride (hBN) flakes on the single-crystalline copper film; and
   providing a second process gas on the single-crystalline copper film to form a graphene layer filling a space between the hBN flakes and being in physical contact with the single-crystalline copper film.

2. The method of claim 1, wherein the first process gas comprises ammonia borane ($H_3NBH_3$), borazine ($B_3H_6N_3$), and a combination thereof.

3. The method of claim 1, wherein the second process gas comprises methane ($CH_4$).

4. The method of claim 1, wherein a flow rate of the second process gas is faster than a flow rate of the first process gas.

5. The method of claim 1, wherein an annealing temperature of the thermal annealing process ranges from about 500° C. to about 1100° C.

6. A manufacturing method of a semiconductor device, comprising:
   depositing a copper film on a substrate;
   performing a thermal annealing process on the copper film;
   depositing hexagonal boron nitride (hBN) flakes onto the copper film;
   depositing a graphene layer on the copper film to wrap around the hBN flakes and be in physical contact with the copper film, so as to form a hBNC layer;
   transferring the hBNC layer onto a wafer;
   forming a gate stack over the hBNC layer; and
   forming source/drain regions aside the gate stack.

7. The method of claim 6, wherein the step of depositing the hBN flakes precedes the step of depositing the graphene layer.

8. The method of claim 6, wherein the copper film is deposited to have a polycrystalline structure, and after the thermal annealing process, the copper film has a single-crystalline structure.

9. The method of claim 6, wherein after the thermal annealing process, the copper film has a stair case profile.

10. The method of claim 6, wherein a duration for depositing the graphene layer is longer than a duration for depositing the hBN flakes.

11. The method of claim 6, wherein a flow rate of precursors for forming the graphene layer is faster than a flow of precursors for forming the hBN flakes.

12. The method of claim 6, wherein the wafer comprises a first hBN layer, and the method further comprises forming a second hBN layer on the hBNC layer such that the hBNC layer is sandwiched between the first hBN layer and the second hBN layer.

13. The method of claim 12, wherein the source/drain regions are formed to be in physical contact with the second hBN layer and are formed to be physically separated from the hBNC layer by the second hBN layer.

14. The method of claim 6, wherein the source/drain regions are formed to be in physical contact with sidewalls of the hBNC layer.

15. A manufacturing method of a semiconductor device, comprising:
   depositing a polycrystalline copper film on a substrate;
   converting the polycrystalline copper film into a single-crystalline copper film by performing a thermal annealing process;
   providing a first process gas on the single-crystalline copper film to form hexagonal boron nitride (hBN) flakes on the single-crystalline copper film; and
   providing a second process gas on the single-crystalline copper film to form a graphene layer filling a space between the hBN flakes and being in physical contact with the single-crystalline copper film, so as to form a hBNC layer;
   providing a gate electrode;
   transferring the hBNC layer onto the gate electrode;
   forming a gate stack over the hBNC layer; and
   forming source/drain regions aside the gate stack.

16. The method of claim 15, wherein after the thermal annealing process, the single-crystalline copper film has a stair case profile.

17. The method of claim 15, wherein orientations of the hBN flakes are substantially aligned.

18. The method of claim 15, further comprising:
   forming a first hBN layer between the gate electrode and the hBNC layer; and
   forming a second hBN layer on the hBNC layer.

19. The method of claim 18, wherein the source/drain regions are formed to be in physical contact with the second hBN layer and are formed to be physically separated from the hBNC layer by the second hBN layer.

20. The method of claim 18, wherein the source/drain regions are formed to be in physical contact with sidewalls of the first hBN layer, sidewalls of the hBNC layer, and sidewalls of the second hBN layer.

* * * * *